US012610749B2

(12) United States Patent
Chen et al.

(10) Patent No.: US 12,610,749 B2
(45) Date of Patent: Apr. 21, 2026

(54) METHOD OF FORMING A RESISTIVE MEMORY DEVICE WITH ULTRA-THIN BARRIER LAYER

(71) Applicant: Taiwan Semiconductor Manufacturing Company Limited, Hsinchu (TW)

(72) Inventors: Hsia-Wei Chen, Taipei City (TW); Chih-Hsiang Chang, Taichung City (TW); Yu-Wen Liao, New Taipei City (TW); Wen-Ting Chu, Kaohsiung City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 793 days.

(21) Appl. No.: 17/852,588

(22) Filed: Jun. 29, 2022

(65) Prior Publication Data

US 2023/0284540 A1 Sep. 7, 2023

Related U.S. Application Data

(60) Provisional application No. 63/316,545, filed on Mar. 4, 2022.

(51) Int. Cl.
H10N 70/00 (2023.01)
H10B 63/00 (2023.01)

(52) U.S. Cl.
CPC ........... H10N 70/023 (2023.02); H10B 63/30 (2023.02); H10N 70/063 (2023.02);
(Continued)

(58) Field of Classification Search
CPC .. H10N 70/231; H10N 70/235; H10N 70/828; H10N 70/821; H10N 70/826;
(Continued)

(56) References Cited

U.S. PATENT DOCUMENTS 7,482,616 B2 * 1/2009 Song .................. H10N 70/8828
257/63
8,946,668 B2 * 2/2015 Saito .................. H01L 23/5228
257/E47.001
(Continued)

FOREIGN PATENT DOCUMENTS

DE 102016100136 A1 6/2017
DE 102019103777 A1 4/2020
(Continued)

OTHER PUBLICATIONS

Xie et al., Diffusion barrier properties of TaNx films prepared by plasma enhanced atomic layer deposition from PDMAT with N2 or NH3 plasma, Jun. 3, 2008, Elsevier, Microelectronic Engineering 85, 2059-2063 (Year: 2008).*
(Continued)

*Primary Examiner* — Yara B Green
*Assistant Examiner* — Benjamin Michael Kupp
(74) *Attorney, Agent, or Firm* — The Marbury Law Group, PLLC

(57) ABSTRACT

A resistive memory device includes an ultrathin barrier layer disposed between the bottom electrode and the bottom electric contact to the memory device. The ultrathin barrier layer may reduce the overall step height of the resistive memory elements by 15% or more, including up to about 20% or more. The use of an ultrathin barrier layer may additionally improve the uniformity of the thickness of the dielectric etch stop layer that partially underlies and extends between the memory elements by at least about 15%. The use of an ultrathin barrier layer may result in improved manufacturability and provide reduced costs and higher yields for resistive memory devices, and may facilitate integration of resistive memory devices in advanced technology nodes.

20 Claims, 21 Drawing Sheets

(52) U.S. Cl.

CPC ......... *H10N 70/066* (2023.02); *H10N 70/068* (2023.02); *H10N 70/826* (2023.02); *H10N 70/841* (2023.02); *H10N 70/8833* (2023.02)

(58) Field of Classification Search

CPC ............. H10N 70/883; H10N 70/8833; H10N 70/023; H10N 70/063; H10N 70/066; H10N 70/068; H10N 70/841; H10N 70/24; H10N 70/801; H10N 79/00; H10B 63/30; H10B 63/20

See application file for complete search history.

(56) References Cited

U.S. PATENT DOCUMENTS

| | | | | |
|---|---|---|---|---|
| 8,946,672 | B2 * | 2/2015 | Tada ................... | H10N 70/841 |
| | | | | 257/E51.001 |
| 11,031,435 | B2 * | 6/2021 | Grobis .................. | H10B 63/80 |
| 11,670,512 | B2 * | 6/2023 | Todd ....................... | C23C 16/40 |
| | | | | 438/674 |
| 2019/0165266 | A1 | 5/2019 | Trinh et al. | |
| 2019/0229265 | A1 | 7/2019 | Chen et al. | |
| 2020/0220078 | A1 | 7/2020 | Ando et al. | |
| 2021/0035992 | A1 | 2/2021 | Chen et al. | |
| 2021/0265566 | A1 | 8/2021 | Kong et al. | |

FOREIGN PATENT DOCUMENTS

| | | | |
|---|---|---|---|
| DE | 102021111424 | A1 | 12/2021 |
| JP | 2005072139 | A | 3/2005 |
| JP | 2010225813 | A | 10/2010 |
| JP | 2013038279 | A | 2/2013 |
| JP | 2014216386 | A | 11/2014 |
| WO | 2008149605 | A1 | 12/2008 |
| WO | 2009/078251 | A1 | 4/2011 |

OTHER PUBLICATIONS

Ritala et al., Controlled Growth of TaN, Ta3N5, and TaOxNy Thin Films by Atomic Layer Deposition, Jun. 4, 1999, American Chemical Society, Chem. Mater. 11, 1712-1718 (Year: 1999).*

Wu et al., Optimization of the CD Uniformity (CDU) in Silicon Oxide Spacer Process for 5 NM FIN SAQP Process Flow, Conference dates: Jun. 26, 2020 through Jul. 17, 2020, China Semiconductor Technology International Conference (CSTIC), published by IEEE, 1-4 (Year: 2020).*

Korean Intellectual Property Office; KR Patent Application No. 10-2023-0028592, Office Action/Notice of Opinion dated Jun. 14, 2024; 12 pages.

JP Intellectual Property Office; JP Patent Application No. 2023-32233, first Office Action dated Mar. 19, 2024; 18 pages.

JP Intellectual Property Office; JP Patent Application No. 2023-32233, Notice of Allowance dated Mar. 18, 2025; 6pages.

German Intellectual Property Office; DE Patent Application No. 102023102405.1, 1st Examination Report dated Jul. 19, 2024; 14 pages.

JP Intellectual Property Office; JP Patent Application 2023-032233, second Office Action dated Sep. 10, 2024; 12 pages.

Korean Intellectual Property Office; KR Patent Application No. 10-2023-0028592, 2nd Office Action/Notice of Opinion dated Feb. 20, 2025; 11 pages.

Taiwan Intellectual Property Office; TW Patent Application No. 112101884, first Office Action dated Jan. 4, 2024; 18 pages.

\* cited by examiner

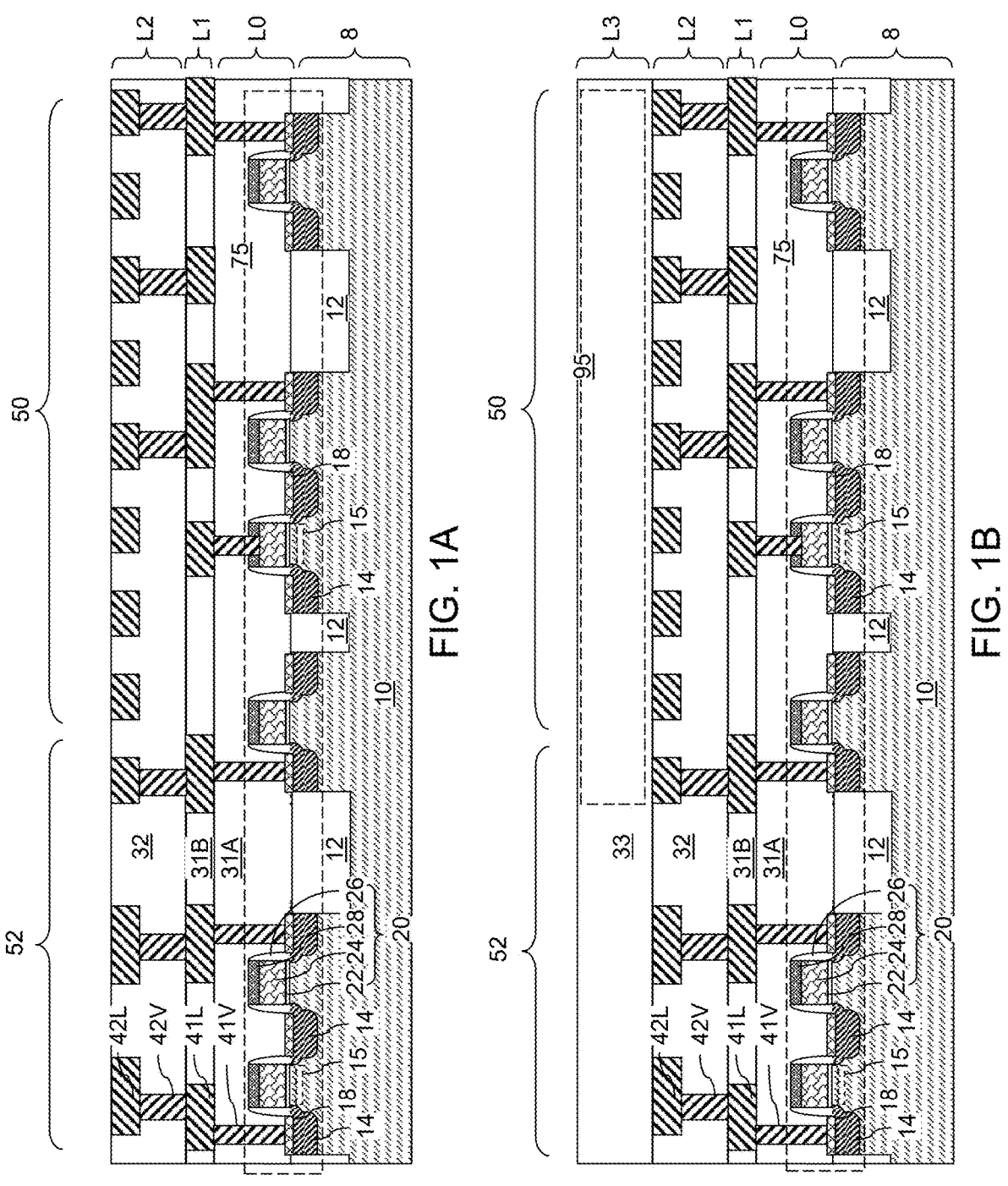

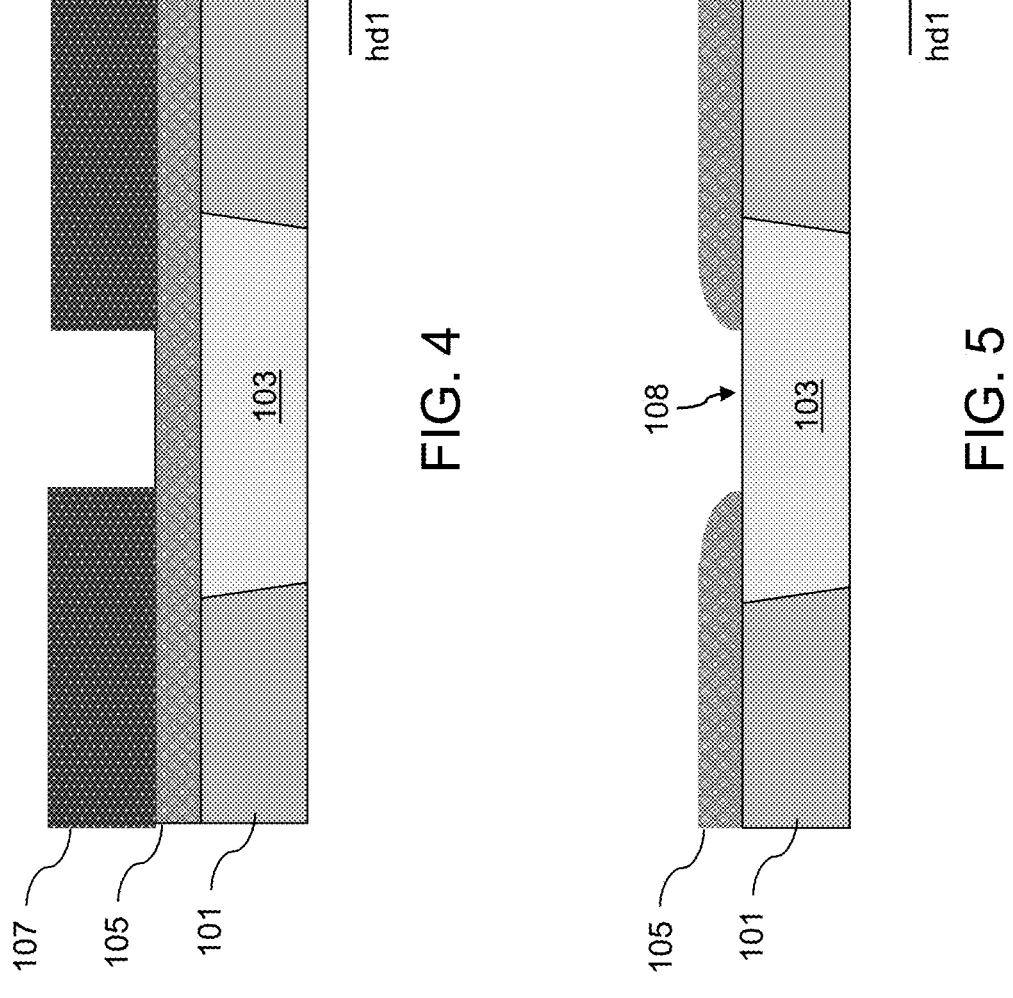

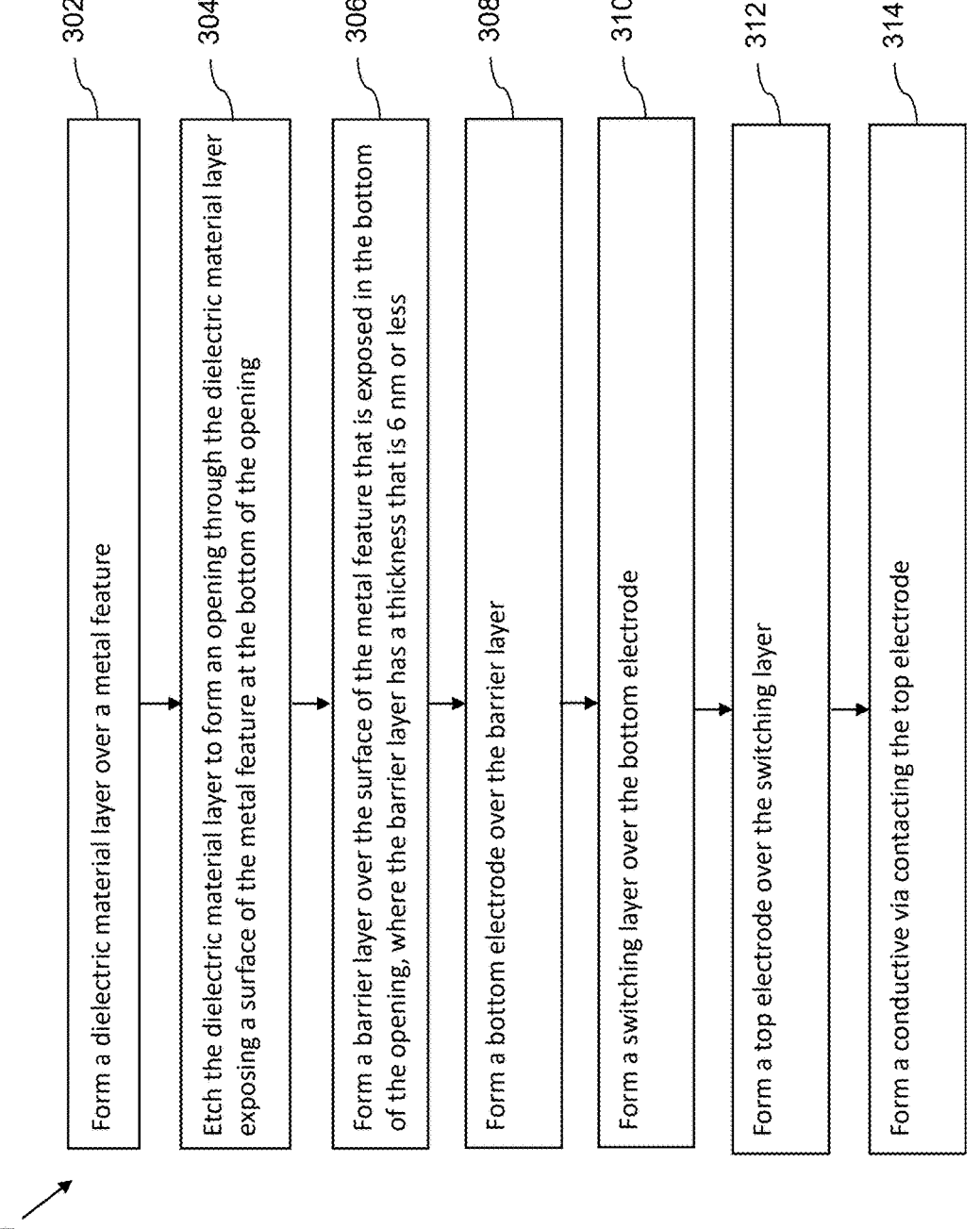

301

302 — Form a dielectric material layer over a metal feature

304 — Etch the dielectric material layer to form an opening through the dielectric material layer exposing a surface of the metal feature at the bottom of the opening 306 — Form a barrier layer over the surface of the metal feature that is exposed in the bottom of the opening, where the barrier layer has a thickness that is 6 nm or less 308 — Form a bottom electrode over the barrier layer 310 — Form a switching layer over the bottom electrode 312 — Form a top electrode over the switching layer 314 — Form a conductive via contacting the top electrode

FIG. 27

METHOD OF FORMING A RESISTIVE MEMORY DEVICE WITH ULTRA-THIN BARRIER LAYER

RELATED APPLICATION

This application claims the benefit of priority to U.S. Provisional Application No. 63/316,545 entitled "RRAM Cells with Ultrathin Barrier for reducing RRAM step height and cost" filed on Mar. 4, 2022, the entire contents of which are incorporated herein by reference for all purposes.

BACKGROUND

Resistive memory devices use a memory element that can provide at least two resistive states. The different resistive states may provide different levels of electrical resistance. An example of an emerging resistive memory device technology is resistive random-access memory (RRAM or ReRAM). A ReRAM device is a non-volatile memory device that operates by changing the resistance across a solid-state dielectric material. As the resistance increases and prevents current from flowing to a node, the memory state may indicate an "off" or "0" state. In contrast, as the resistance decreases, current may flow and may indicate an "on" or "1" state. Other emerging non-volatile memory technologies that utilize similar resistive switching principles include phase-change memory (PCM), magnetoresistive random-access memory (MRAM), conductive-bridging RAM (CBRAM) and carbon nanotube (CNT) memory. These emerging technologies are often considered as potential replacements for flash memory. However, to date these technologies have not been widely adopted. There is a continuing need for improvements in resistive memory technologies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a vertical cross-sectional view of a first exemplary structure prior to formation of an array of memory devices according to an embodiment of the present disclosure.

FIG. 1B is a vertical cross-sectional view of the first exemplary structure during formation of the array of memory devices according to an embodiment of the present disclosure.

FIG. 4 is a vertical cross-sectional view of an exemplary intermediate structure during a process of forming a resistive memory device that includes a patterned mask formed over the upper surface of the second dielectric material layer according to an embodiment of the present disclosure.

FIG. 5 is a vertical cross-section view of an exemplary intermediate structure during a process of forming a resistive memory device showing an opening formed through the second dielectric material layer to expose the upper surface of the metal feature according to an embodiment of the present disclosure.

FIG. 27 is a flowchart illustrating a method of fabricating a resistive memory device according to an embodiment of the present disclosure.

DETAILED DESCRIPTION

Figure 1C:
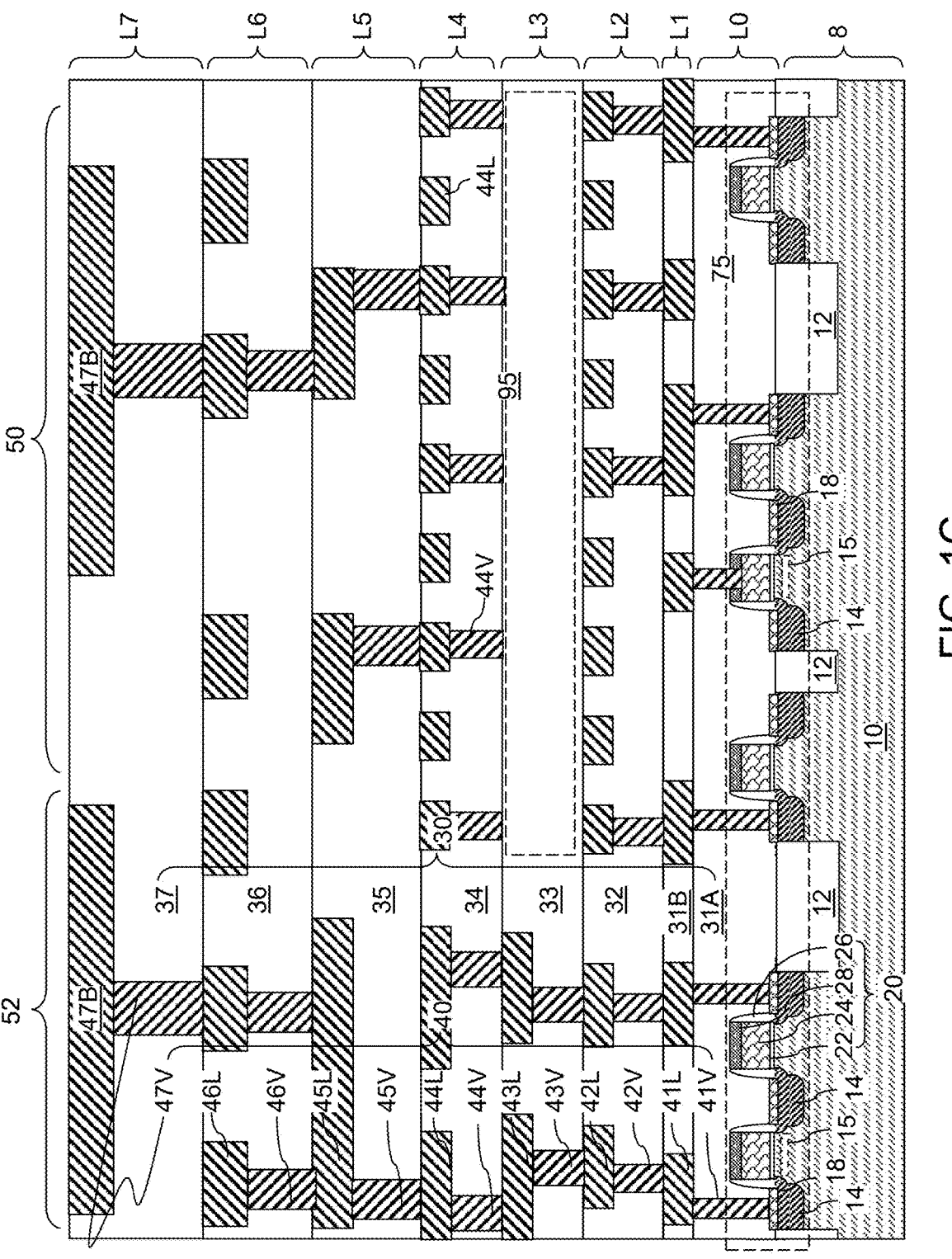
FIG. 1C is a vertical cross-sectional view of the first exemplary intermediate structure after formation of upper-level metal interconnect structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, various embodiments disclosed herein may include resistive memory devices, such as resistive random-access memory (ReRAM) devices, and methods of forming resistive memory devices having an ultrathin barrier layer between a bottom electrode and an electrical contact to the resistive memory device.

As used herein, a "resistive memory device" includes a memory device in which data may be stored in a memory element by changing the electrical resistance of the memory element. The change in electrical resistance of the memory element may be incurred rapidly (e.g., in less than 10 minutes, such as less than 1 minute, including less than 1 second), may be non-volatile (i.e., the memory element will retain its resistance state in the absence of applied power for a prolonged time period, such as greater than 24 hours), and may be reversible. A resistive memory device typically includes a large number of independently functioning memory cells (such as more than 103, more than 105, more than 106, or more than 109 memory cells) organized into a memory array, where each memory cell of the memory array may include a memory element that can provide at least two resistive states providing different levels of electrical resistance.

The resistive states of the individual memory elements of a resistive memory device may be modified by applying electrical stress to the memory elements, such as through voltage or current pulsing. In the case of ReRAM memory devices, for example, the memory elements may have an initial first state of electrical resistance. In embodiments, the memory elements may include a dielectric material, and their initial state of electrical resistance may be a relatively highly resistive state. An initial, one-time "forming" step (also known as an "electroforming" step) may be performed by applying one or more voltage pulses at a sufficiently high voltage to induce a soft breakdown in the material of the memory elements. Following this "forming" step, the electrical resistance of the memory elements may be significantly decreased, such that they are in a stable Low Resistance State (LRS).

To reverse this process, a "Reset" process may be performed by applying one or more additional voltage pulses, which may have opposite polarity from the voltage pulse(s) used during the "forming" step, that causes the electrical resistance of the memory elements to increase, such that they are in a stable High Resistance State (HRS). The "Reset" process may break the conduction paths, or "filaments," through the memory elements, causing the memory elements to again become relatively highly resistive. The resistivity of the memory elements after a "Reset" may be close to their original resistive state prior to the "forming" step. A "Set" process may be performed by applying one or more additional voltage pulses, which may have the same polarity as the voltage pulse(s) used during the initial "forming" step, to cause the conduction paths to re-form, and convert the memory elements back to the Low Resistance State (LRS).

Thus, individual memory cells of the memory array may be programmed by changing the memory elements of the cell from a High Resistance State (HRS) to a Low Resistance State (LRS), or vice versa. During a read operation, a low voltage may be applied to the memory elements, and the logic state of each memory cell may be determined based on the current flow through the memory cell. A relatively higher current flow indicates that the memory element in the cell has a Low Resistance State (LRS), while a relatively lower current flow indicates that the memory element has a High Resistance State (HRS). The difference in the detected current between memory elements having a High Resistance State (HRS) and a Low Resistance State (LRS) may be referred to as the "memory window" of the resistive memory device. In some embodiments, the high current flow (i.e., LRS) may indicate a stored data value of "1" while a low current flow (i.e., HRS) may indicate a stored data value of "0".

One type of resistive memory device may include individual memory elements (i.e., memory cells) composed of a layer stack that includes a switching layer (which may also be referred to as a "storage layer") formed of a dielectric material, a first conductive layer located on one side of the switching layer (which may also be referred to a "bottom electrode"), and a second conductive layer located on the other side of the switching layer (which may also be referred to as a "top electrode"). Electrical contacts may electrically contact the top electrode and the bottom electrode on opposite sides of the layer stack. In embodiments in which the switching layer and the top electrode and bottom electrode extend in a horizontal direction (i.e., parallel to the surface of a support substrate), the electrical contacts to the layer stack may include metal features, such as metal lines or vias, embedded in a dielectric material. A resistive memory device having such a configuration may be an attractive option for back-end-of-line (BEOL) integration due to the ease of manufacture of the individual memory elements.

When forming a resistive memory element as described above, a barrier layer is normally deposited prior to the deposition of the bottom electrode layer. The purpose of the barrier layer is to prevent diffusion of material from the bottom electrical contact (e.g., metal line or via) into the bottom electrode of the memory element, which may contaminate the bottom electrode and degrade the performance of the memory element. The barrier layer is typically formed using a physical deposition technique, such as physical vapor deposition (PVD). The barrier layer may have a thickness of 18 nm or more.

The presence of a relatively thick barrier layer contributes to a relatively large vertical height, or "step height" of the resistive memory element. Larger step heights of the memory elements result in increased processing times, leading to higher fabrication costs and lower throughput, and can also inhibit integration of resistive memory devices in advanced technology nodes.

In addition, forming the resistive memory elements may require an etching process to remove material, including portions of the barrier layer, from between each of the layer stacks which form the individual memory elements. The etching process used to remove portions of the relatively thick barrier layer may increase processing time and may result in uneven thickness and damage to the dielectric etch stop layer that partially underlies and extends between the memory elements. This may negatively affect device yields.

In order to address the above-described issues in resistive memory devices, such as a resistive random-access memory (ReRAM) device, the various embodiments disclosed herein include a resistive memory device including an ultrathin barrier layer disposed between the bottom electrode and the bottom electric contact to the memory device. In various embodiments, the thickness of the barrier layer may be 6 nm or less, such as between about 0.3 nm and about 6 nm, including between about 1 nm and about 4.5 nm. The ultrathin barrier layer may reduce the overall step height of the resistive memory elements by 15% or more, including up to about 20% or more. The use of an ultrathin barrier layer in accordance with the various embodiments may additionally improve the uniformity of the thickness of the dielectric etch stop layer that partially underlies and extends between the memory elements by at least about 15%. In various embodiments, the ultrathin barrier layer may be formed using a conformal deposition process, such as atomic layer deposition (ALD). The various embodiments that utilize an ultrathin barrier layer may result in improved manufacturability and provide reduced costs and higher yields for resistive memory devices, and may facilitate integration of resistive memory devices in advanced technology nodes.

Referring to FIG. 1A, a vertical cross-sectional view of a first exemplary structure according to an embodiment of the present disclosure is illustrated prior to formation of an array of memory devices, according to various embodiments of the present disclosure. The first exemplary structure may include a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include various devices regions, which may include a memory array region 50 in which at least one array of non-volatile memory cells may be subsequently formed.

The exemplary structure may also include a peripheral logic region 52 in which electrical connections between each array of non-volatile memory cells and a peripheral circuit including field effect transistors may be subsequently formed. Areas of the memory array region 50 and the logic region 52 may be used to form various elements of the peripheral circuit.

Semiconductor devices such as field effect transistors (FETs) may be formed on, and/or in, the semiconductor material layer 10 during a front-end-of-line (FEOL) operation. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions 18. Complementary metal-oxide-semiconductor (CMOS) circuits 75 may be provided on the semiconductor material layer 10, which may include a periphery circuit for the array(s) of transistors, such as thin film transistors (TFTs), and memory devices to be subsequently formed.

Various interconnect-level structures may be subsequently formed, which are formed prior to formation of an array of memory devices and are herein referred to as lower interconnect-level structures (L0, L1, L2). In embodiments in which a two-dimensional array of memory devices is to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect level dielectric (ILD) layer 31B and first metal lines 41L formed within the first ILD layer 31B. The first ILD layer 31B is also referred to as a first line-level dielectric layer. The first metal lines 41L may contact a respective one of the contact via structures 41V. The second interconnect-level structure L2 includes a second ILD layer 32, which may include a stack of a first via-level dielectric material layer and a second line-level dielectric material layer or a line-and-via-level dielectric material layer. The second ILD layer 32 may have formed there within second interconnect-level metal interconnect structures (42V, 42L), which includes first metal via structures 42V and second metal lines 42L. Top surfaces of the second metal lines 42L may be coplanar with the top surface of the second ILD layer 32.

FIG. 1B is a vertical cross-sectional view of the first exemplary structure during formation of an array of memory devices, according to an embodiment of the present disclosure. Referring to FIG. 1B, an array 95 of non-volatile memory cells, such as resistive memory devices, may be formed in the memory array region 50 over the second interconnect-level structure L2. The details for the structure and the processing steps for the array 95 of non-volatile memory cells are subsequently described in detail below. A third ILD layer 33 may be formed during formation of the array 95 of non-volatile memory cells. The set of all structures formed at the level of the array 95 of non-volatile memory cells is herein referred to as a third interconnect-level structure L3.

FIG. 1C is a vertical cross-sectional view of the first exemplary structure after formation of upper-level metal interconnect structures according to an embodiment of the present disclosure. Referring to FIG. 1C, third interconnect-level metal interconnect structures (43V, 43L) may be formed in the third ILD layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth ILD layer 34 having formed therein fourth interconnect-level metal interconnect structures (44V, 44L), which may include third metal via structures 44V and fourth metal lines 44L. The fifth interconnect-level structure L5 may include a fifth ILD layer 35 having formed therein fifth interconnect-level metal interconnect structures (45V, 45L), which may include fourth metal via structures 45V and fifth metal lines 45L. The sixth interconnect-level structure L6 may include a sixth ILD layer 36 having formed therein sixth interconnect-level metal interconnect structures (46V, 46L), which may include fifth metal via structures 46V and sixth metal lines 46L. The seventh interconnect-level structure L7 may include a seventh ILD layer 37 having formed therein sixth metal via structures 47V (which are seventh interconnect-level metal interconnect structures) and metal bonding pads 47B. The metal bonding pads 47B may be configured for solder bonding (which may use C4 ball bonding or wire bonding), or may be configured for metal-to-metal bonding (such as copper-to-copper bonding).

Each ILD layer may be referred to as an ILD layer 30. Each of the interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by using two single damascene processes, or may be simultaneously formed as a unitary structure using a dual damascene process. Each of the metal interconnect structure 40 may include a respective metallic liner (such as a layer of TiN, TaN, or WN having a thickness in a range from 2 nanometers (nm) to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30, or may be incorporated into one or more of the ILD layers 30.

While the present disclosure is described using an embodiment in which the array 95 of non-volatile memory cells, such as resistive memory devices, may be formed as a component of a third interconnect-level structure L3, embodiments are expressly contemplated herein in which the array 95 of non-volatile memory cells may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of non-volatile memory cells may be provided within multiple interconnect-level structures in the memory array region 50. While the present disclosure is described using an embodiment in which an array 95 of non-volatile memory cells may be formed in a single interconnect-level structure, embodiments are expressly contemplated herein in which an array 95 of non-volatile memory cells may be formed over two vertically adjoining interconnect-level structures. Furthermore, embodiments are expressly contemplated herein in which an array 95 of non-volatile memory cells may be formed on or within the semiconductor material layer 10 (e.g., in a front-end-of-line (FEOL) operation).

Figures 2, 3:
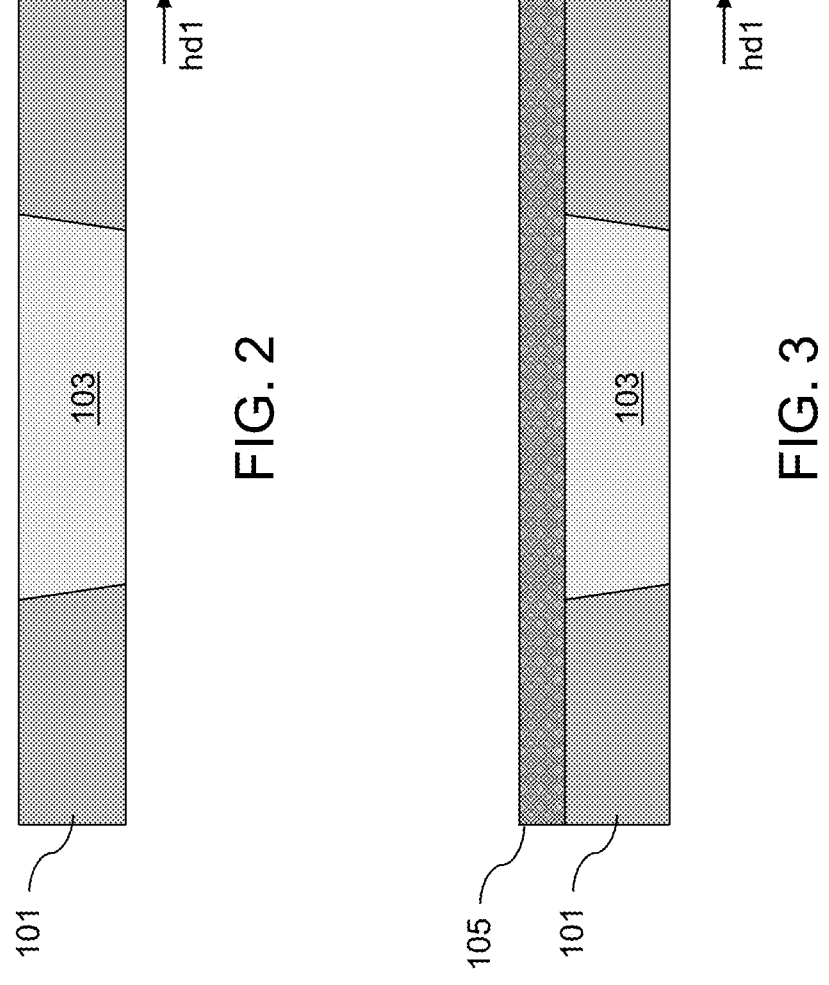
FIG. 2 is a vertical cross-sectional view of an exemplary intermediate structure during a process of forming a resistive memory device including a first dielectric material layer and a metal feature embedded in the first dielectric material layer according to an embodiment of the present disclosure.
FIG. 3 is a vertical cross-sectional view of an exemplary intermediate structure during a process of forming a resistive memory device that includes a second dielectric material layer deposited over the upper surfaces of the first dielectric material layer and the metal feature according to an embodiment of the present disclosure.

FIGS. 2-21 are sequential vertical cross-sectional views of an exemplary structure during a process of forming a resistive memory device according to various embodiments of the present disclosure. The resistive memory device may form a memory cell that is a part of an array 95 of memory cells such as shown in FIGS. 1B and 1C. Referring to FIG. 2, a first dielectric material layer 101 may be deposited over a substrate, such as a substrate 8 containing a semiconductor material layer 10 as shown in FIGS. 1A-1C. The substrate 8 may include control elements formed during FEOL processes. In some embodiments, one or more additional dielectric material layers, such as ILD layers, may be deposited between the substrate 8 and the first dielectric material layer 101. In such embodiments, the first dielectric material layer 101 may be omitted. For example, ILD layer 32 discussed above with respect to FIGS. 1B and 1C may be substituted for the first dielectric material layer 101.

The first dielectric material layer 101 may be formed of any suitable dielectric material such as silicon oxide ($SiO_2$), silicon nitride ($SiN_4$), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$), tantalum oxide ($Ta_2O_5$), aluminum oxide ($Al_2O_3$), hafnium dioxide-alumina ($HfO_2$—$Al_2O_3$), zirconium oxide ($ZrO_2$), silicon carbide (SiC) or the like. In some embodiments, the first dielectric material layer 101 may be formed of a low-k dielectric material, such as fluorosilicate glass (FSG), hydrogen silsesquioxane (HSQ), benzocyclobutene (BCB), organic polymeric dielectric materials, carbon-doped silicon oxide, porous silica, polymer foams, and the like. In some embodiments, the first dielectric material layer 101 may be a native oxide layer formed on the substrate 8. Other suitable dielectric materials are also within the contemplated scope of disclosure.

The first dielectric material layer 101 may be deposited using any suitable deposition process. Herein, suitable deposition processes may include chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like.

Referring again to FIG. 2, a metal feature 103, such as a metal line or via, may be embedded in the first dielectric material layer 101. In some embodiments, one or more additional metal interconnect structures, such as metal via structures and metal lines, may be deposited between the substrate 8 and the metal feature 103. In such embodiments, the metal feature 103 may be omitted. For example, a metal line 42L or via 42V discussed above with respect to FIGS. 1B and 1C may be substituted for metal feature 103.

In various embodiments, the metal feature 103 be laterally surrounded by the first dielectric material layer 101. In various embodiments, an upper surface of the metal feature 103 may be substantially co-planar with the upper surface of the first dielectric material layer 101. As described in further detail below, at least one resistive memory device may be subsequently formed over the upper surface of the metal feature 103. Accordingly, the metal feature 103 may also be referred to as a bottom metal feature 103.

The metal feature 103 may include any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), molybdenum (Mo), osmium (Os), thorium (Th), vanadium (V), alloys thereof, and combinations of the same. In some embodiments, the metal feature 103 may include a metallic liner (such as a layer of TiN, TaN, or WN) contacting the first dielectric material layer 101, and a metallic fill material (such as W, Cu, Co, Mo, Ru, other elemental metals, or an alloy or a combination thereof) located over the metallic liner. Other suitable electrically conductive materials for the metal feature 103 are within the contemplated scope of disclosure.

The metal feature 103 may be formed by selectively etching the first dielectric material layer 101 through a photolithographically-patterned mask to form one or more trenches or openings in the first dielectric material layer 101, depositing one or more metallic materials (e.g., a metallic liner layer and a metallic fill material) over the upper surface of the first dielectric material layer 101 and within the one or more trenches or openings, and performing a planarization process, such as a chemical mechanical planarization (CMP) process to remove the metallic material(s) from over the upper surface of the first dielectric material layer 101 and provide one or more metal features 103 embedded in the first dielectric material layer 101. The metallic material(s) of the metal feature 103 may be deposited using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), electrochemical deposition, or combinations thereof.

In some embodiments, a plurality of metal features 103 may be formed in the first dielectric material layer 101, where each metal feature 103 may be embedded in and laterally surrounded by the first dielectric material layer 101. The plurality of metal features 103 may be spaced apart from one another along at least a first horizontal direction hd1.

FIG. 3 is a vertical cross-sectional view of an exemplary intermediate structure during a process of forming a resistive memory device that includes a second dielectric material layer 105 deposited over the upper surfaces of the first dielectric material layer 101 and the metal feature 103 according to an embodiment of the present disclosure. Referring to FIG. 3, the second dielectric material layer 105 may be composed of a suitable dielectric material as described above, and may be deposited using a suitable deposition process as described above. In various embodiments, the second dielectric material layer 105 may be composed of a different dielectric material than the first dielectric material layer 101. In some embodiments, the second dielectric material layer 105 may be an etch stop layer having different etch characteristics (i.e., a high etch resistivity) to an etch chemistry used in a subsequent etching step. In one non-limiting embodiment, the second dielectric material layer 105 may include silicon carbide. The second dielectric material layer 105 may have a thickness that is less than the thickness of the first dielectric material layer 101. In some embodiments, the thickness of the second dielectric material layer 105 may be between about 5 nm and about 30 nm, although greater and lesser thicknesses for the second dielectric material layer 105 are within the contemplated scope of disclosure.

FIG. 4 is a vertical cross-sectional view of an exemplary intermediate structure during a process of forming a resistive memory device that includes a patterned mask 107 formed over the upper surface of the second dielectric material layer 105 according to an embodiment of the present disclosure. Referring to FIG. 4, the mask 107, which may include a layer of photoresist and/or a hard mask, may be patterned using a photolithographic technique to form one or more openings through the mask 107.

FIG. 5 is a vertical cross-section view of an exemplary intermediate structure during a process of forming a resistive memory device showing an opening 108 formed through the second dielectric material layer 105 to expose the upper surface of the metal feature 103 according to an embodiment of the present disclosure. Referring to FIG. 5, the exemplary intermediate structure may be etched through the patterned mask 107 to remove portions of the second dielectric material layer 105 and expose the upper surface of the metal feature 103. Following the etching process, the patterned mask 107 may be removed using a suitable process, such as by ashing or by dissolution using a solvent.

In some embodiments, the etching process may form a plurality of openings 108 through the second dielectric material layer 105. Each of the openings 108 may expose a portion of an upper surface of a metal feature 103. Each of the openings 108 may correspond to the location of a resistive memory element of an array of resistive memory elements to be subsequently formed.

Figures 6, 7:
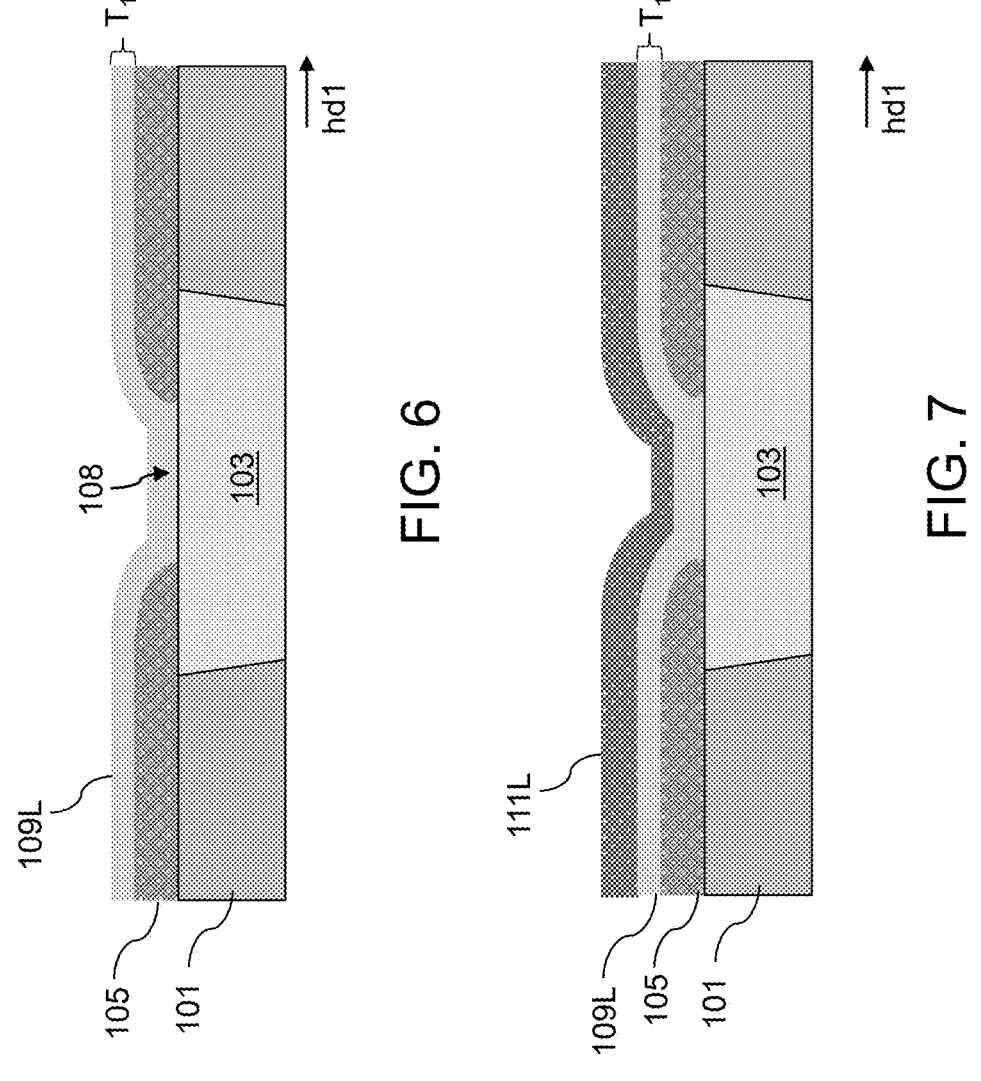
FIG. 6 is a vertical cross-section view of an exemplary intermediate structure during a process of forming a resistive memory device showing a continuous barrier layer deposited over the upper surface and side surfaces of the second dielectric material layer, and over the exposed upper surface of the metal feature on the bottom surface of the opening.
FIG. 7 is a vertical cross-section view of an exemplary intermediate structure during a process of forming a resistive memory device showing a continuous bottom electrode layer deposited over upper surface of the continuous barrier layer according to an embodiment of the present disclosure.

FIG. 6 is a vertical cross-section view of an exemplary intermediate structure during a process of forming a resistive memory device showing a continuous barrier layer 109L deposited over the upper surface and side surfaces of the second dielectric material layer 105, and over the exposed upper surface of the metal feature 103 on the bottom surface of the opening 108. Referring to FIG. 6, the continuous barrier layer 109L may be deposited using a conformal deposition process. In various embodiments, the continuous barrier layer 109L may be deposited using atomic layer deposition (ALD). The ALD deposition process is a thin-film deposition process in which a film is grown on a surface by exposing the surface to an alternating sequence of gaseous species, which may be referred to as precursor pulses. Other suitable deposition processes capable of producing a thin-film are within the contemplated scope of the disclosure.

The continuous barrier layer 109L may be composed of a conductive material that functions as a diffusion barrier that prevents or substantially inhibits diffusion of the material(s) of the metal feature 103 into a bottom electrode of a resistive memory device to be subsequently formed over the continuous barrier layer 109L. In various embodiments, the continuous barrier layer 109L may include a conductive oxide, nitride and/or oxynitride material. In some embodiments, the conductive oxide, nitride and/or oxynitride material of the continuous barrier layer 109L may include at least one metal selected from aluminum (Al), manganese (Mn), cobalt (Co), titanium (Ti), tantalum (Ta), tungsten (W), nickel (Ni), tin (Sn), and magnesium (Mg). In one non-limiting embodiment, the continuous barrier layer 109L may include tantalum nitride (TaN).

Referring again to FIG. 6, the continuous barrier layer 109L may have a thickness, $T_1$, that is 6 nm or less, such as between about 0.3 nm and about 6 nm, including between about 1 nm and about 4.5 nm. Greater and lesser thicknesses, $T_1$, for the continuous barrier layer 109L are within the contemplated scope of disclosure. The thickness, $T_1$, of the continuous barrier layer 109L may be sufficient to provide an effective diffusion barrier while not being so large as to result in excessive resistance across the continuous barrier layer 109L. In one non-limiting embodiment, the thickness $T_1$ of the continuous barrier layer 109L may be between about 2 nm and about 3 nm.

In embodiments in which the continuous barrier layer 109L is formed by ALD, the deposition process may include a thermal ALD process and/or a plasma-enhanced ALD process. In various embodiments, the ALD deposition process may be performed at a temperature between 150° C. and 300° C. Suitable precursors for use in an ALD process for forming a continuous barrier layer 109L including TaN may include, for example, pentakis (dimethylamino) tantalum (V) (PDMAT) and/or tantalum chloride ($TaCl_5$) as a tantalum precursor, and ammonia ($NH_3$) as a nitrogen precursor. Other suitable precursor materials are within the contemplated scope of disclosure.

In various embodiments, the density of the continuous barrier layer 109L formed by ALD may be greater than the density of an equivalent barrier layer formed by physical vapor deposition (PVD). Accordingly, a continuous barrier layer 109L formed by ALD according to various embodiments may be considerably thinner (e.g., ≤6 nm, compared to ~18 nm for a layer formed by PVD) while still providing an effective diffusion barrier. The comparatively thinner barrier layer according to various embodiments may enable a reduction in the overall step height of the resistive memory element(s) to be subsequently formed. Further, by using a conformal deposition process, such as ALD, the thickness $T_1$ of the continuous barrier layer 109L may be more effectively controlled, and the thickness $T_1$ may have minimal or no variation across the exemplary intermediate structure.

FIG. 7 is a vertical cross-section view of an exemplary intermediate structure during a process of forming a resistive memory device showing a continuous bottom electrode layer 111L deposited over upper surface of the continuous barrier layer 109L according to an embodiment of the present disclosure. The continuous bottom electrode layer 111L may include any suitable electrically conductive material, such as titanium (Ti), titanium nitride (TiN), gold (Au), ruthenium (Ru), tungsten (W), tungsten nitride (WN), aluminum copper (AlCu), tantalum (Ta), tantalum nitride (TaN), molybdenum (Mo), palladium (Pd), platinum (Pt), cobalt (Co), nickel (Ni), iridium (Ir), iron (Fe), beryllium (Be), chromium (Cr), antimony (Sb), molybdenum (Mo), osmium (Os), thorium (Th), vanadium (V), copper (Cu), aluminum (Al), zirconium (Zr), alloys thereof, and combinations of the same. Other suitable electrically conductive materials for the continuous bottom electrode layer 111L are within the contemplated scope of disclosure. The continuous bottom electrode layer 111L may include single layer of a conductive material or multiple layers of conductive materials that may have the same or different compositions. The continuous bottom electrode layer 111L may be deposited using a suitable deposition method as described above.

Figures 8, 9:
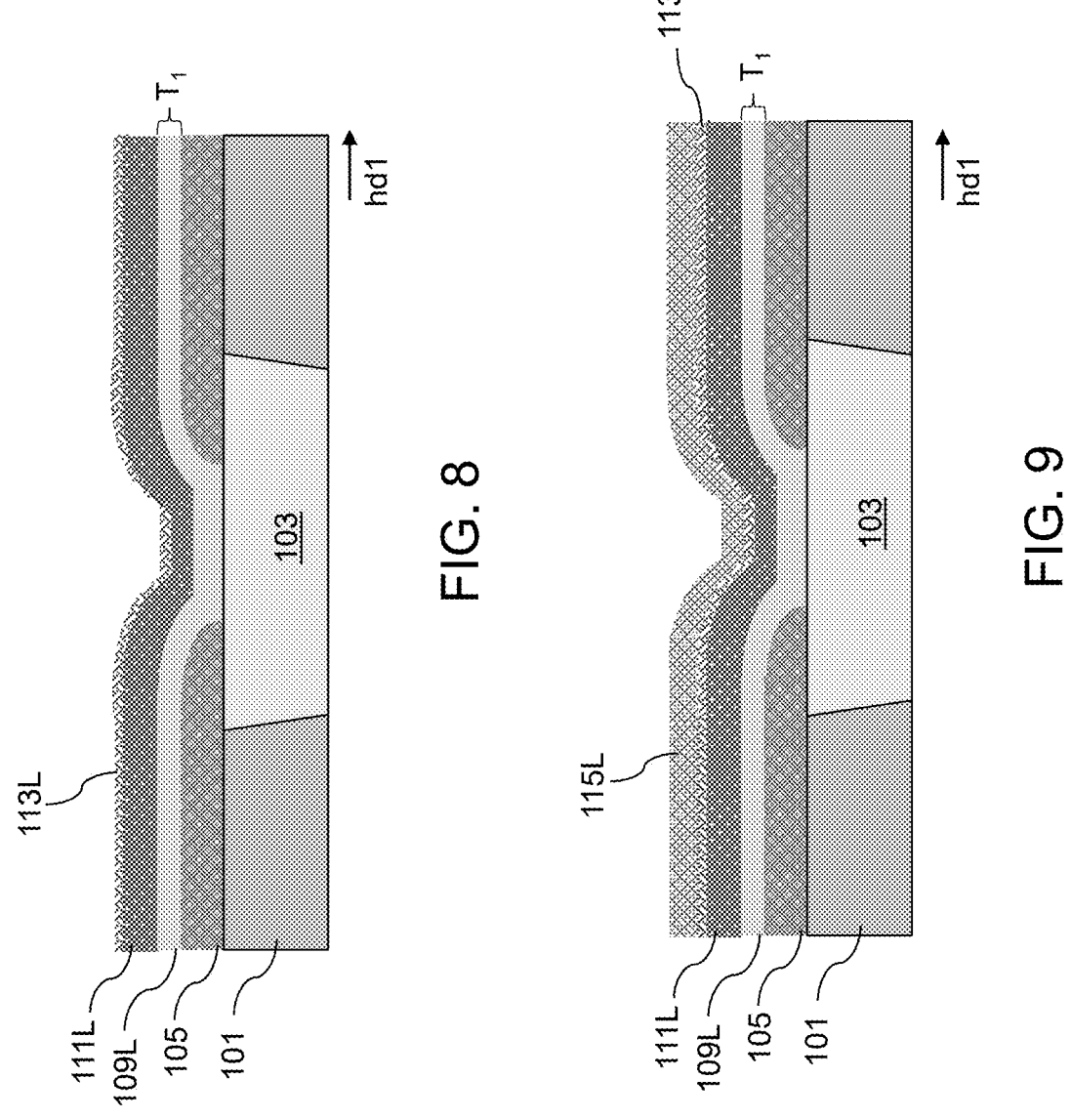
FIG. 8 is a vertical cross-section view of an exemplary intermediate structure during a process of forming a resistive memory device that shows a continuous switching layer deposited over the continuous bottom electrode layer according to an embodiment of the present disclosure.
FIG. 9 is a vertical cross-section view of an exemplary intermediate structure during a process of forming a resistive memory device that shows an optional continuous capping layer deposited over the continuous switching layer according to an embodiment of the present disclosure.

FIG. 8 is a vertical cross-section view of an exemplary intermediate structure during a process of forming a resistive memory device that shows a continuous switching layer 113L deposited over the continuous bottom electrode layer 111L according to an embodiment of the present disclosure. In various embodiments, the continuous switching layer 113L may be conformally deposited over the upper surface of the continuous bottom electrode layer 111L. The continuous switching layer 113L may be deposited using a suitable deposition process as described above.

The continuous switching layer 113L may include a solid-state dielectric material that may be switchable between a High Resistance State (HRS) and a Low Resistance State (LRS). Suitable materials for the continuous switching layer 113L may include, for example, a dielectric material, a metal oxide and/or a high-k material, such as titanium dioxide ($TiO_2$), hafnium dioxide ($HFO_2$), hafnium-aluminum-dioxide ($HF_xAl_{1-x}O_2$), tantalum pentoxide ($Ta_2O_5$), tungsten dioxide ($WO_2$), zirconium dioxide ($ZrO_2$), hafnium zirconium oxide ($Hf_xZr_{1-x}O_2$, where $0.1 \leq x \leq 0.9$), aluminum oxide ($Al_2O_3$), nickel oxide (NiO), zinc oxide (ZnO) and silicon oxide ($SiO_2$). Other suitable materials having a resistive switching property are within the contemplated scope of disclosure. The continuous switching layer 113L may include single layer of material or multiple layers of materials that may have the same or different compositions.

FIG. 9 is a vertical cross-section view of an exemplary intermediate structure during a process of forming a resistive memory device that shows an optional continuous capping layer 115L deposited over the continuous switching layer 113L according to an embodiment of the present disclosure. In various embodiments, the optional continuous capping layer 115L may be conformally deposited over the upper surface of the continuous switching layer 113L. The optional continuous capping layer 115L may be deposited using a suitable deposition process as described above.

The optional continuous capping layer 115L may include a material that provides an oxygen storage function that facilitates phase changes in the dielectric material of the continuous switching layer 113L. In some embodiments, the continuous capping layer 115L may be a metal or metal oxide that is relatively low in oxygen concentration. Suitable metal materials for the optional continuous capping layer 115L may include, for example, titanium (Ti), hafnium (Hf), platinum (Pt), tantalum (Ta) and aluminum (Al), including combinations and alloys thereof. Suitable metal oxide materials for the optional continuous capping layer 115L may include, for example, titanium oxide ($TiO_x$), hafnium oxide ($HfO_x$), zirconium oxide ($ZrO_x$), germanium oxide ($GeO_x$), cerium oxide ($CeO_x$), and tantalum oxide ($TaO_x$), including combinations of the same. Other suitable capping layer materials having an oxygen storage function are within the contemplated scope of disclosure.

Figures 10, 11:
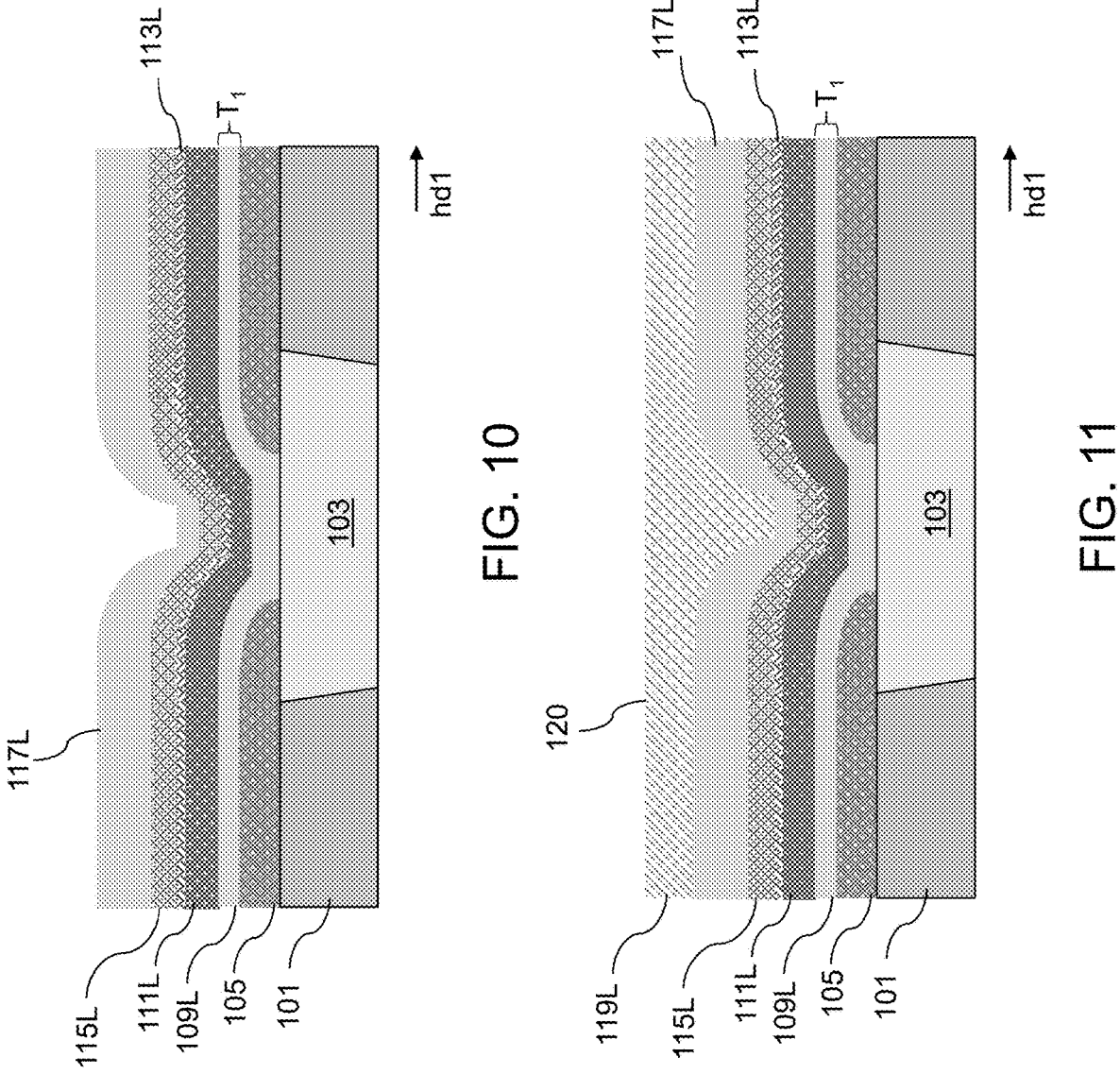
FIG. 10 is a vertical cross-section view of an exemplary intermediate structure during a process of forming a resistive memory device that shows a continuous top electrode layer deposited over the optional continuous capping layer according to an embodiment of the present disclosure.
FIG. 11 is a vertical cross-section view of an exemplary intermediate structure during a process of forming a resistive memory device that shows a continuous hard mask layer deposited over the continuous top electrode layer according to an embodiment of the present disclosure.

FIG. 10 is a vertical cross-section view of an exemplary intermediate structure during a process of forming a resistive memory device that shows a continuous top electrode layer 117L deposited over the optional continuous capping layer 115L according to an embodiment of the present disclosure. In embodiments in which the optional capping layer 115L is not present, the continuous top electrode layer 117L may be deposited over the upper surface of the continuous switching layer 113L. The continuous top electrode layer 117L may be deposited using a suitable deposition process as described above.

The continuous top electrode layer 117L may include any suitable electrically conductive material, such as titanium (Ti), titanium nitride (TiN), gold (Au), tungsten (W), tungsten nitride (WN), aluminum copper (AlCu), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), molybdenum (Mo), osmium (Os), thorium (Th), vanadium (V), copper (Cu), aluminum (Al), zirconium (Zr), alloys thereof, and combinations of the same. Other suitable materials for the continuous top electrode layer 117L are within the contemplated scope of disclosure. In some embodiments, the continuous top electrode layer 117L may be composed of the same material(s) as the continuous bottom electrode layer 111L. Alternatively, the continuous top electrode layer 117L and the continuous bottom electrode layer 111L may be composed of different materials. The continuous top electrode layer 117L may include single layer of a conductive material or multiple layers of conductive materials that may have the same or different compositions.

FIG. 11 is a vertical cross-section view of an exemplary intermediate structure during a process of forming a resistive memory device that shows a continuous hard mask layer 119L deposited over the continuous top electrode layer 117L according to an embodiment of the present disclosure. The continuous hard mask layer 119L may be composed of a suitable dielectric material, such as silicon carbide (SiC), silicon oxynitride (SiON), silicon nitride (SiN) and the like. Other suitable materials for the continuous hard mask layer 119L are within the contemplated scope of disclosure. The continuous hard mask layer 119L may be deposited using a suitable deposition process as described above. In embodiments, a planarization process, such as a chemical mechanical planarization (CMP) process may be performed to provide a planar upper surface 120 of the continuous hard mask layer 119L as shown in FIG. 11.

Figures 12, 13:
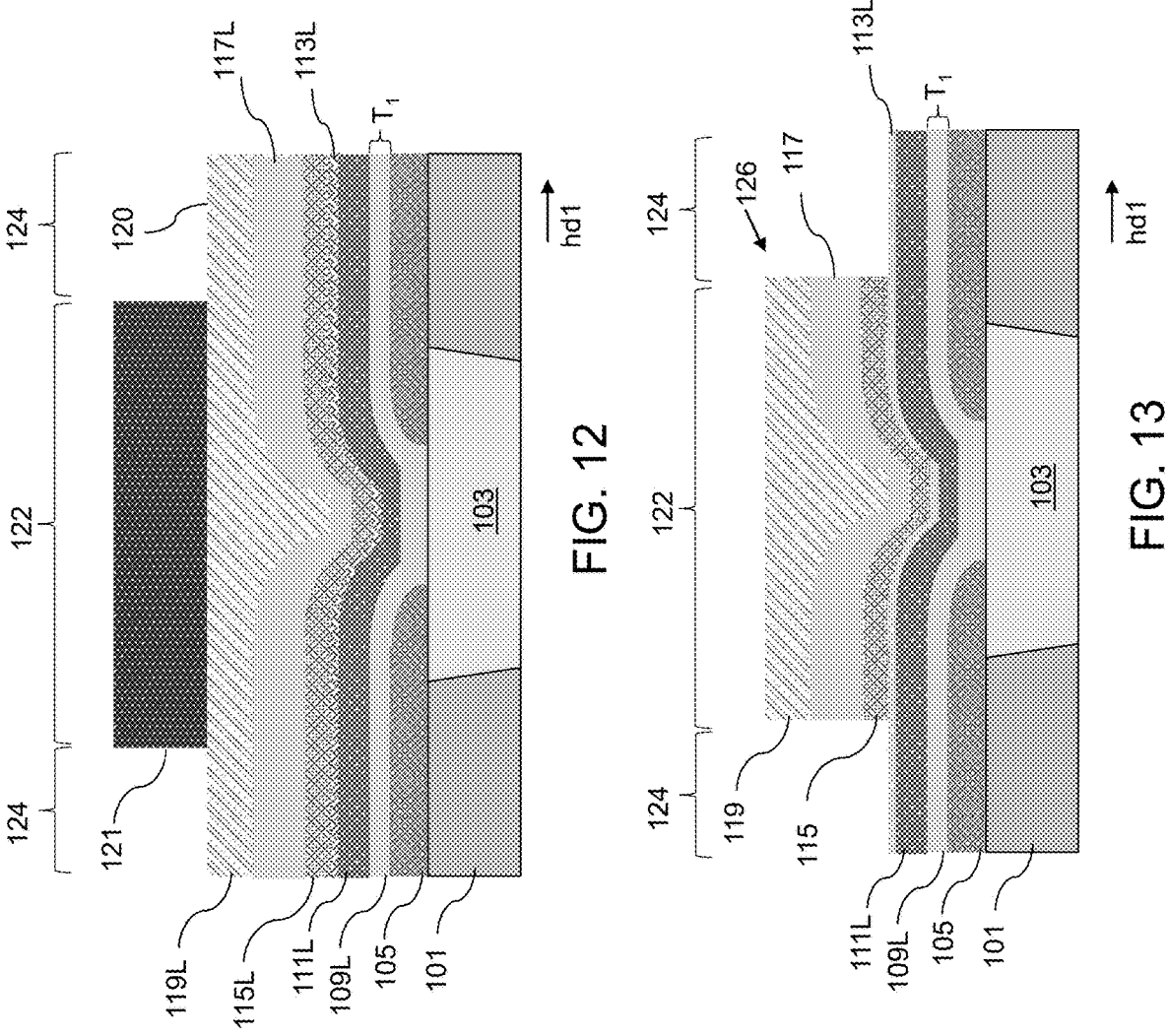
FIG. 12 is a vertical cross-sectional view of an exemplary intermediate structure during a process of forming a resistive memory device that includes a patterned mask located over the continuous hard mask layer according to an embodiment of the present disclosure.
FIG. 13 is a vertical cross-sectional view of an exemplary intermediate structure during a process of forming a resistive memory device following an etching process that removes portions of the continuous hard mask layer, the continuous top electrode layer, and the optional continuous capping layer to provide a first layer stack over the continuous switching layer according to an embodiment of the present disclosure.

FIG. 12 is a vertical cross-sectional view of an exemplary intermediate structure during a process of forming a resistive memory device that includes a patterned mask 121 located over the continuous hard mask layer 119L according to an embodiment of the present disclosure. Referring to FIG. 12, the patterned mask 121 may include a layer of photoresist that is patterned using a photolithographic technique such that a first region 122 of the of the exemplary structure is covered by the patterned mask 121 and a second region 124 of the exemplary structure is exposed through the patterned mask 121. The first region 122 may overlie the metal feature 103 and may correspond to the location of a resistive memory element to be subsequently formed. In various embodiments, the exemplary intermediate structure may include a plurality of first regions 122 that are covered by the patterned mask 121, where each first region 122 overlies a metal feature 103 and corresponds to the location of a resistive memory element to be subsequently formed. The second region 124 that is exposed through the patterned mask 121 may extend continuously between the respective first regions 122.

FIG. 13 is a vertical cross-sectional view of an exemplary intermediate structure during a process of forming a resistive memory device following an etching process that removes portions of the continuous hard mask layer 119L, the continuous top electrode layer 117L, and the optional continuous capping layer 115L to provide a first layer stack 126 over the continuous switching layer 113L according to an embodiment of the present disclosure. Referring to FIG. 13, an etching process, such as an anisotropic etching process, may be used to remove portions of the continuous hard mask layer 119L, the continuous top electrode layer 117L, and the optional continuous capping layer 115L from the second region 124 of the exemplary intermediate structure that is exposed through the patterned mask 121. In some embodiments, the etching process may include multiple etching steps. For example, an initial etching step may be performed to remove portions of the continuous hard mask layer 119L and provide a discrete hard mask 119 within the first region 122. The patterned mask 121 may optionally be removed via a suitable process, such as by ashing or dissolution using a solvent. Then, one or more subsequent etching steps may be performed to remove portions of the continuous top electrode layer 117L, and the optional continuous capping layer 115L to provide the first layer stack 126 that includes the discrete hard mask 119, a discrete top electrode 117 and optionally a discrete capping layer 115 over the continuous switching layer 113L. The subsequent etching step(s) may use a different etching chemistry than the initial etching step such that the hard mask 119 may protect the top electrode 117 and the optional capping layer 115 from being etched in the first region 122 of the exemplary intermediate structure.

In various embodiments, following the etching process the exemplary intermediate structure may include a plurality of first layer stacks 126 over the continuous switching layer 113L, where each first layer stack 126 may overlie a metal feature 103 and may correspond to the location of a resistive memory element to be subsequently formed.

Figure 14:
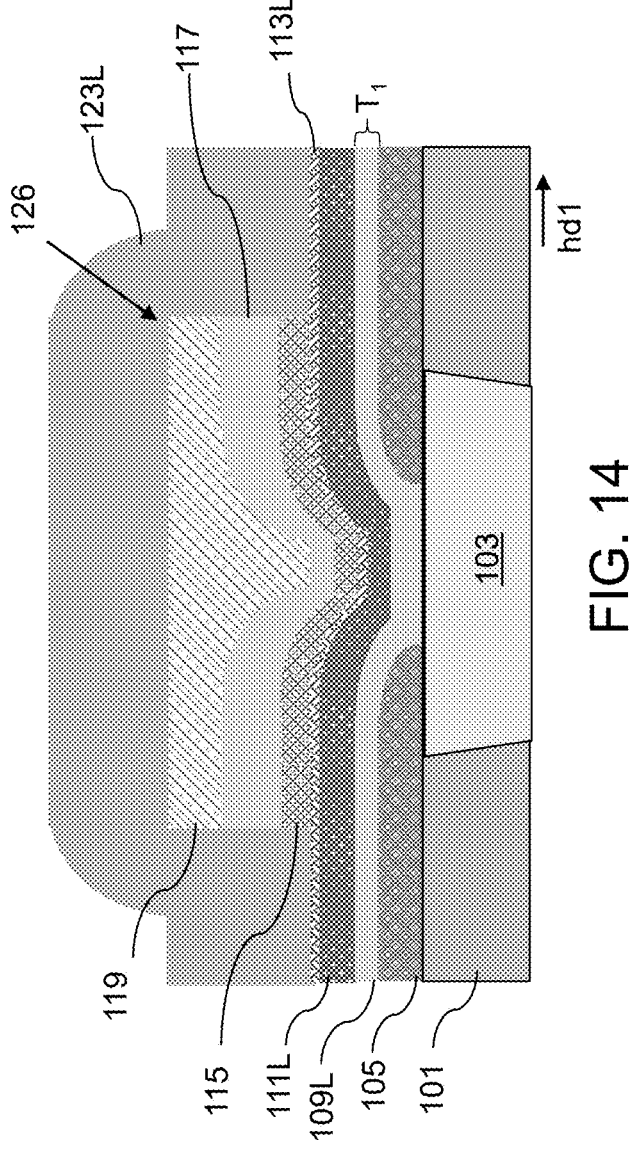
FIG. 14 is a vertical cross-sectional view of an exemplary intermediate structure during a process of forming a resistive memory device illustrating a continuous spacer material layer deposited over the exposed upper surface of the continuous switching layer and over the upper surface and the side surfaces of the first layer stack according to an embodiment of the present disclosure.

FIG. 14 is a vertical cross-sectional view of an exemplary intermediate structure during a process of forming a resistive memory device illustrating a continuous spacer material layer 123L deposited over the exposed upper surface of the continuous switching layer 113L and over the upper surface and the side surfaces of the first layer stack 126 according to an embodiment of the present disclosure. Referring to FIG. 14, the continuous spacer material layer 123L may be composed of a suitable dielectric material as described above, including an oxide and/or a nitride material (e.g., SiN) and may be deposited using a suitable deposition process as described above.

Figure 15:
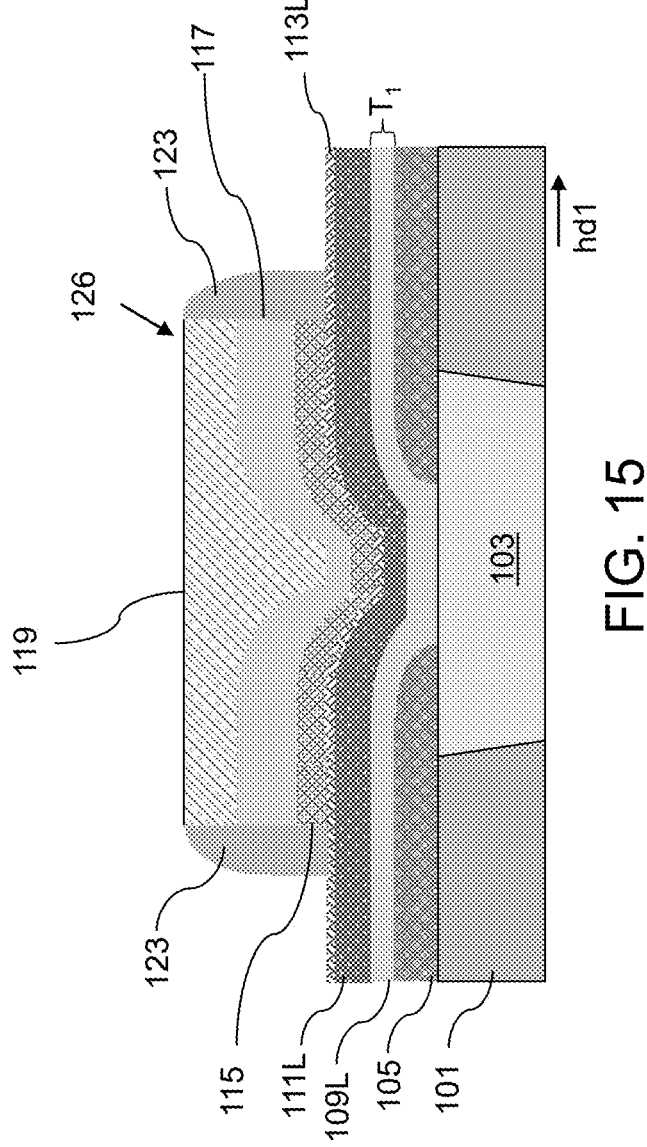
FIG. 15 is a vertical cross-sectional view of an exemplary intermediate structure during a process of forming a resistive memory device following an etching process that removes portions of the continuous spacer material layer to form at least one spacer over the side surfaces of the first layer stack according to an embodiment of the present disclosure.

FIG. 15 is a vertical cross-sectional view of an exemplary intermediate structure during a process of forming a resistive memory device following an etching process that removes portions of the continuous spacer material layer 123L to form at least one spacer 123 over the side surfaces of the first layer stack 126 according to an embodiment of the present disclosure. Referring to FIG. 15, an etching process may be performed to remove the continuous spacer material layer 123L from over the upper surface of the hard mask 119 and from over portions of the continuous switching layer 113L. Following the etching process, the remaining portion of the continuous spacer material layer 123 may form at least one spacer 123. In some embodiments, a single spacer 123 may extend continuously around the periphery of the first layer stack 126. Alternatively, multiple spacers 123 may be located on different side surfaces of the first layer stack 126. The at least one spacer 123 may be located over the continuous switching layer 113L and may extend along the side surfaces of the first layer stack 126.

Figure 16:
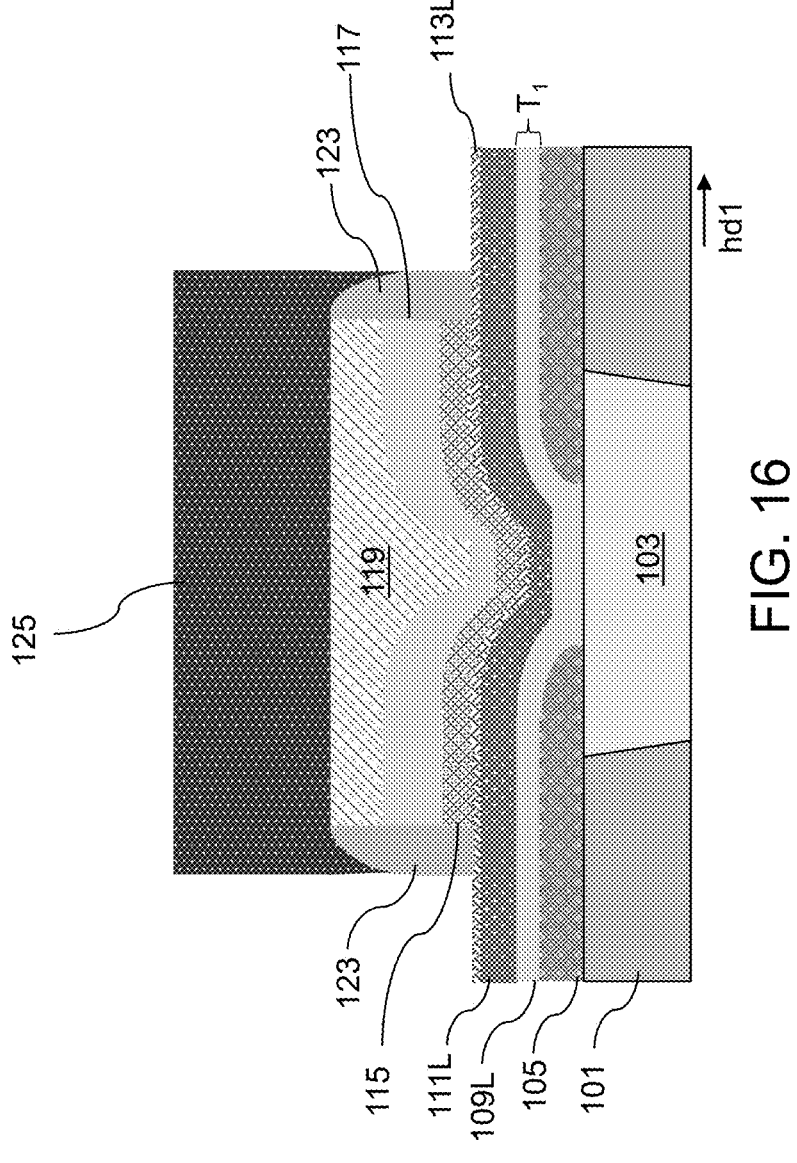
FIG. 16 is a vertical cross-sectional view of an exemplary intermediate structure during a process of forming a resistive memory device that includes a patterned mask located over the upper surfaces of the hard mask and the at least one spacer according to an embodiment of the present disclosure.

FIG. 16 is a vertical cross-sectional view of an exemplary intermediate structure during a process of forming a resistive memory device that includes a patterned mask 125 located over the upper surfaces of the hard mask 119 and the at least one spacer 123 according to an embodiment of the present disclosure. Referring to FIG. 16, the patterned mask 125 may include a layer of photoresist that is patterned using a photolithographic technique such the patterned mask 125 covers the first layer stack 126 and the at least one spacer 123 extending over the side surfaces of the first layer stack 126. The upper surface of the continuous switching layer 113L may be exposed through the patterned mask 125. In embodiments in which the exemplary structure includes a plurality of first layer stacks 126, the patterned mask 125 may cover each of the first layer stacks 126 and the spacers 123 extending over the side surfaces of the layer stacks 126.

Figure 17:
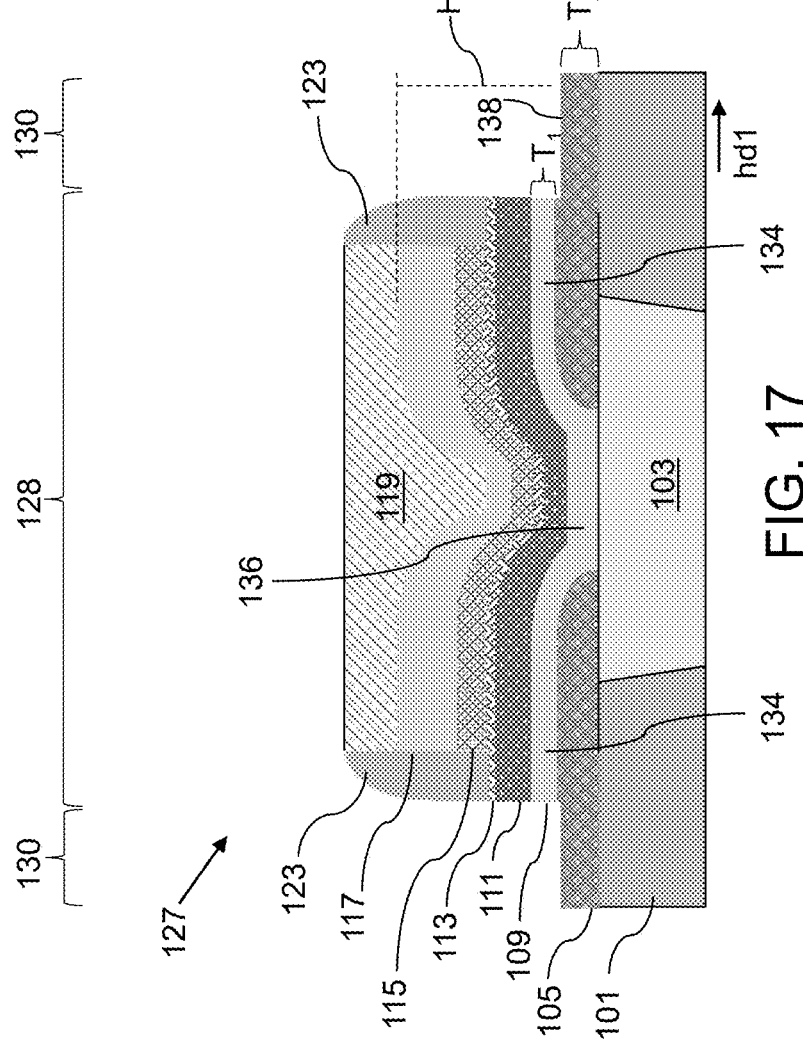
FIG. 17 is a vertical cross-sectional view of an exemplary intermediate structure during a process of forming a resistive memory device following an etching process that removes portions of the continuous switching layer, the continuous bottom electrode layer, and continuous barrier layer to provide a second layer stack according to an embodiment of the present disclosure.

FIG. 17 is a vertical cross-sectional view of an exemplary intermediate structure during a process of forming a resistive memory device following an etching process that removes portions of the continuous switching layer 113L, the continuous bottom electrode layer 111L, and continuous barrier layer 109L to provide a second layer stack 127 according to an embodiment of the present disclosure. Referring to FIG. 17, an etching process, such as an anisotropic etching process, may be used to remove portions of the continuous switching layer 113L, the continuous bottom electrode layer 111L, and continuous barrier layer 109L that are exposed through the patterned mask 125. The etching process may stop at the second dielectric material layer 105. The patterned mask 125 may protect the hard mask 119, the top electrode 117, the optional capping layer 115 and the at least one spacer 123 from being etched during the etching process. In various embodiments, the second dielectric material layer 105 may be an etch stop layer having a higher etch resistivity to the etch chemistry used to remove portions of the continuous barrier layer 109L than the material of the continuous barrier layer 109L. Following the etching process, the patterned mask 125 may be removed using a suitable process, such as via ashing or by dissolution using a solvent.

The etching process may form a second layer stack 127 that includes a discrete barrier layer 109, a discrete bottom electrode 111 over the barrier layer 109, a discrete switching layer 113 over the bottom electrode 111, the optional capping layer 115 over the switching layer 113, the top electrode 117 over the optional capping layer 115, and the hard mask 119 over the top electrode 117. The second layer stack 127 may also include at least one spacer 123 over the upper surface of the switching layer 113 and over the side surfaces of the optional capping layer 115, the top electrode 117 and the hard mask 119. The second layer stack 127 may be located in a third region 128 of the exemplary intermediate structure. The third region 128 may have a greater lateral extent along at least one horizontal direction (e.g., hd1 in FIG. 17) than the first region 122 described above with reference to FIG. 12. The upper surface of the second dielectric material layer 105 may be exposed in a fourth region 130 of the exemplary intermediate structure. The fourth region 130 may laterally surround the second layer stack 127.

In various embodiments, the exemplary intermediate structure may include a plurality of third regions 128, where each third region 128 may include a second layer stack 127 as shown in FIG. 17. The fourth region 130 in which the upper surface of the second dielectric material layer 105 is exposed may extend continuously between the second layer stacks 127 within each of the third regions 128.

Referring again to FIG. 17, the barrier layer 109 of the second layer stack 127 may have a thickness, $T_1$, that is 6 nm or less, such as between about 0.3 nm and about 6 nm, including between about 1 nm and about 4.5 nm. In various embodiments, the barrier layer 109 may include an outer portion 134 that extends in a horizontal direction over the upper surface of the second dielectric material layer 105, and a central portion 136 that is vertically recessed relative to the outer portion 134 and extends in a horizontal direction over the upper surface of the metal feature 103. The recessed central portion 136 may be located between the metal feature 103 and the bottom electrode 111. In various embodiments, the recessed central portion 136 of the barrier layer 109 may directly contact the upper surface of the metal feature 103 and may also directly contact a lower surface of the bottom electrode 111.

In various embodiments, the lower surface of the recessed central portion 136 of the barrier layer 109 may be co-planar with the lower surface of the second dielectric material layer 105. In various embodiments, an upper surface 138 of the second dielectric material layer 105 within the fourth region 130 of the exemplary intermediate structure may be co-planar with, or located vertically below, the lower surface of the outer portion 134 of the barrier layer 109. In the exemplary intermediate structure shown in FIG. 17, each of the bottom electrode 111, the switching layer 113, the optional capping layer 115, and the top electrode 117 may have a similar shape as the barrier layer 109, and may include an outer portion that extends in a horizontal direction over the outer portion 134 of the barrier layer 109, and a central portion that is vertically recessed with respect to the outer portion located above the recessed central portion 136 of the barrier layer 109.

The second dielectric material layer 105 may have a thickness $T_2$ in the fourth region 130 of the exemplary intermediate structure. In some embodiments, following the etching process that forms the second layer stack 127 in the third region 128 of the exemplary intermediate structure, the thickness $T_2$ of the second dielectric material layer 105 in the fourth region 130 may be less than the thickness of the second dielectric material layer 105 in the third region 128. In some embodiments, the thickness $T_2$ of the second dielectric material layer 105 in the fourth region 130 may be less than the thickness of the second dielectric material layer 105 in the third region 128 by at least about 1 nm. The uniformity of the thickness $T_2$ of the second dielectric material layer 105 in the fourth region 130 of the exemplary intermediate structure may be characterized by a half-range uniformity percentage that is equal to one-half of the range between the maximum thickness and the minimum thickness of the second dielectric material layer 105 divided by the mean thickness of the second dielectric material layer 105, multiplied by 100. In various embodiments, the half-range uniformity percentage of the thickness $T_2$ may be less than 9%, including less than 8% when measured using a suitable thickness measurement technique, such as a spectral reflectometry technique that is commonly used to measure thicknesses of thin films at the nanoscale. In some embodiments, the thickness $T_2$ may have a 3-sigma uniformity metric of less than 14%, such as less than 12%.

In various embodiments, the thickness $T_2$ of the second dielectric material layer 105 may have improved uniformity relative to an equivalent structure having a thick (e.g., $\geq 18$ nm) barrier layer 109. The inclusion of an ultrathin (e.g., $\leq 6$ nm) barrier layer 109 in accordance with various embodiments may enable greater control during the etching process used to remove portions of the continuous barrier layer 109L to expose the upper surface 138 of the second dielectric material layer 105. With a relatively thicker barrier layer 109, non-uniformities in the etching process may result in over-etching of portions of the second dielectric material layer 105. This may result in damage to the second dielectric material layer 105, which may have a negative effect on device yields. In contrast, various embodiments according to the present disclosure may provide an improvement of at least about 15% in the uniformity of the thickness $T_2$ of the second dielectric material layer 105. Accordingly, damage to the second dielectric material layer 105 may be mitigated and device yields may be improved.

Referring again to FIG. 17, a step height H of each of the second layer stacks 127 may be defined as the maximum vertical distance between the upper surface 138 of the second dielectric material layer 105 and the upper surface of the top electrode 117 in the second layer stack 127. In various embodiments, the step height(s) H in the exemplary intermediate structure may be less than 80 nm, including less than 70 nm, such as about 67 nm. By using an ultrathin (e.g., $\leq 6$ nm) barrier layer 109, the step height H may be reduced by at least about 15%, including up to about 20% as compared an equivalent structure having a thick (e.g., $\geq 18$ nm) barrier layer 109, which may have a step heigh H of at least about 82 nm. The reduction in step height H may result in decreased processing times, lower manufacturing costs and higher throughput, and may facilitate integration of resistive memory devices in accordance with various embodiments with advanced technology nodes.

Figure 18:
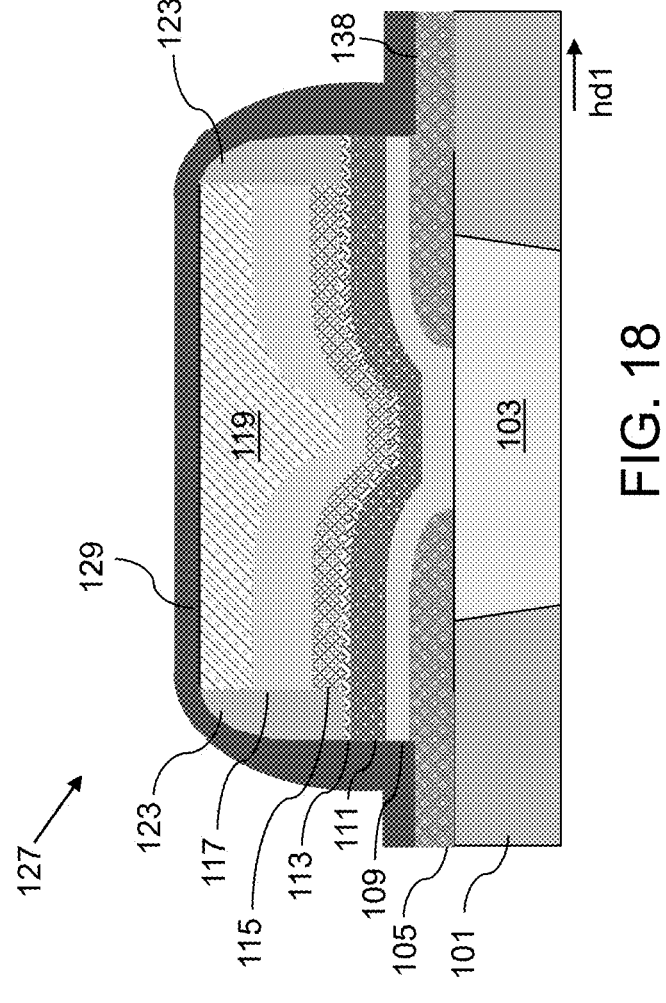
FIG. 18 is a vertical cross-sectional view of an exemplary intermediate structure during a process of forming a resistive memory device that includes a third dielectric material layer over the exposed upper surface of the second dielectric material layer and over the side surfaces and upper surface of the second layer stack according to an embodiment of the present disclosure.

FIG. 18 is a vertical cross-sectional view of an exemplary intermediate structure during a process of forming a resistive memory device that includes a third dielectric material layer 129 over the exposed upper surface 138 of the second dielectric material layer 105 and over the side surfaces and upper surface of the second layer stack 127 according to an embodiment of the present disclosure. Referring to FIG. 18, the third dielectric material layer 129 may be conformally deposited over the upper surface 138 of the second dielectric material layer 105 and over the side surfaces and upper surface of the second layer stack 127 using a suitable deposition process as described above. The third dielectric material layer 129 may be composed of a suitable dielectric material as described above. In various embodiments, the third dielectric material layer 129 may be an etch stop layer having different etch characteristics (i.e., a high etch resistivity) to an etch chemistry used in a subsequent etching step.

Figure 19:
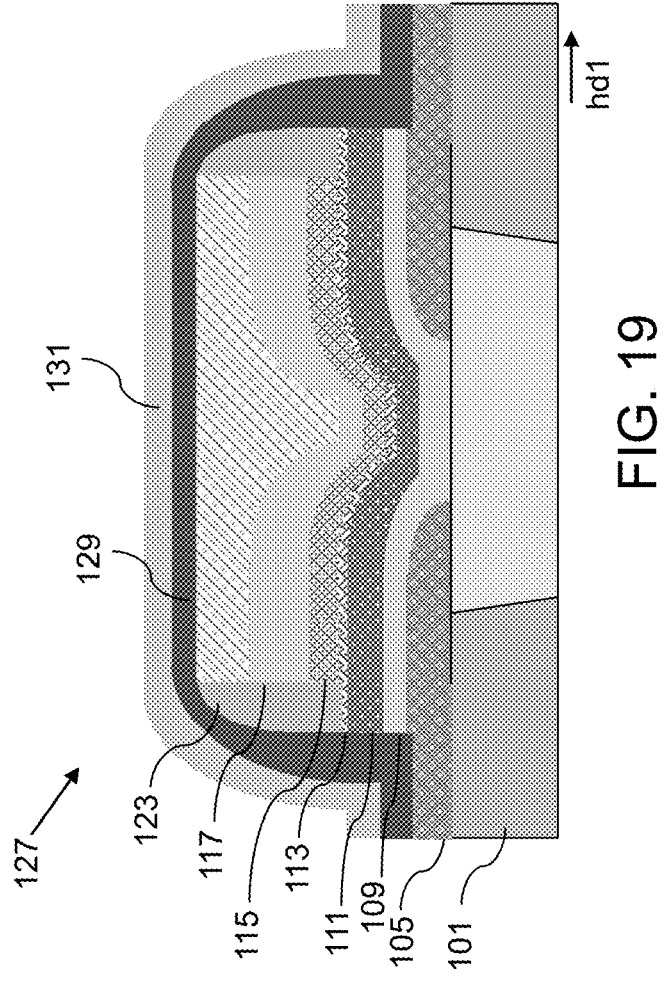
FIG. 19 is a vertical cross-sectional view of an exemplary intermediate structure during a process of forming a resistive memory device that includes a buffer layer over the third dielectric material layer according to various embodiments of the present disclosure.

FIG. 19 is a vertical cross-sectional view of an exemplary intermediate structure during a process of forming a resistive memory device that includes an optional buffer layer 131 over the third dielectric material layer 129 according to various embodiments of the present disclosure. Referring to FIG. 19, the optional buffer layer 131 may be deposited over the upper surface of the third dielectric material layer 129 using a suitable deposition process as described above. In some embodiments, the buffer layer 131 may be conformally deposited over the third dielectric material layer 129 in order to reduce stress between the third dielectric material layer 129 and a fourth dielectric layer (e.g., a low-k dielectric material layer) that may be subsequently deposited over the exemplary intermediate structure. The optional buffer layer may include, for example, silicon oxide, including silicon oxide formed using a tetraethyl orthosilicate (TEOS) precursor. Other suitable materials for the optional buffer layer 131 are within the contemplated scope of disclosure.

Figure 20:
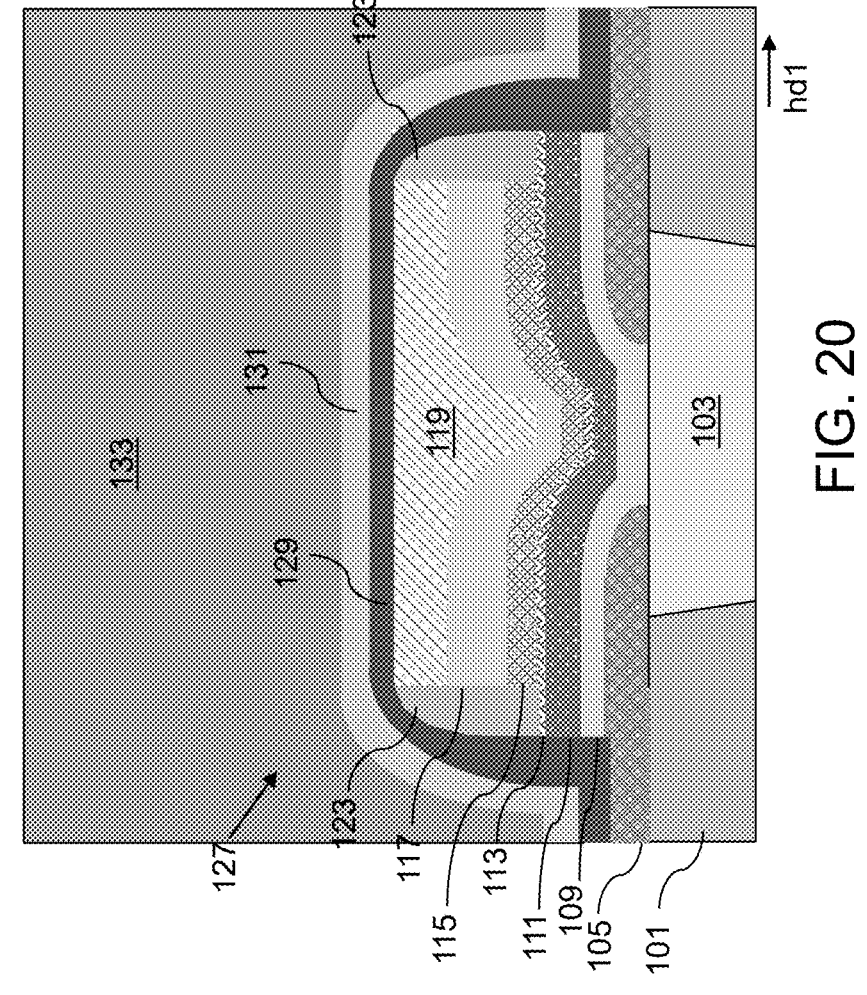
FIG. 20 is a vertical cross-sectional view of an exemplary intermediate structure during a process of forming a resistive memory device that includes a fourth dielectric material layer over the buffer layer according to various embodiments of the present disclosure.

FIG. 20 is a vertical cross-sectional view of an exemplary intermediate structure during a process of forming a resistive memory device that includes a fourth dielectric material layer 133 over the buffer layer 131 according to various embodiments of the present disclosure. Referring to FIG. 20, the fourth dielectric material layer 133 may be deposited over the upper surface of the buffer layer 131 using a suitable deposition process as described above. A planarization process, such as a chemical mechanical planarization (CMP) process, may optionally be used to provide a planar upper surface of the fourth dielectric material layer 133. The fourth dielectric material layer 133 may include a suitable dielectric material as described above. In some embodiments, the fourth dielectric material layer 133 may include a low-k dielectric material, such as fluorosilicate glass (FSG), hydrogen silsesquioxane (HSQ), benzocyclobutene (BCB), organic polymeric dielectric materials, carbon-doped silicon oxide, porous silica, polymer foams, and the like. Other suitable dielectric materials are within the contemplated scope of disclosure. In some embodiments, the fourth dielectric material layer 133 may be composed of the same material as the first dielectric material layer 101. Alternatively, the fourth dielectric material layer 133 may have a different composition than the first dielectric material layer 101.

Figure 21:
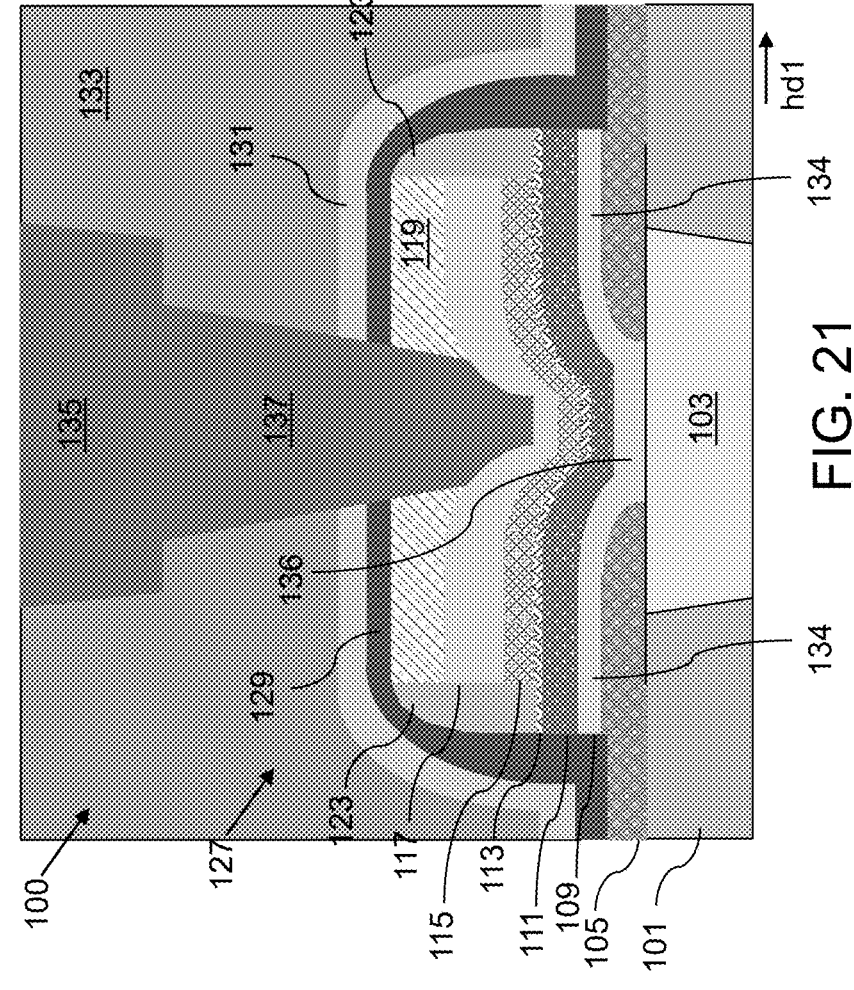
FIG. 21 is a vertical cross-sectional view of a resistive memory device including a metal line and a conductive via extending from the metal line through the fourth dielectric material layer, the buffer layer, the third dielectric material layer, and the hard mask and contacting the upper surface of the top electrode according to various embodiments of the present disclosure.

FIG. 21 is a vertical cross-sectional view of a resistive memory device 100 including a metal line 135 and a conductive via 137 extending from the metal line 135 through the fourth dielectric material layer 133, the buffer layer 131, the third dielectric material layer 129, and the hard mask 119 and contacting the upper surface of the top electrode 117 according to various embodiments of the present disclosure. Referring to FIG. 21, the metal line 135 and the conductive via 137 may be formed by selectively etching the exemplary intermediate structure through a photolithographically-patterned mask to form a via opening extending through the fourth dielectric material layer 133, the buffer layer 131, the third dielectric material layer 129, and the hard mask 119 and by selectively etching the fourth dielectric material layer 133 through a photolithographically-patterned mask to form a trench opening for the metal line 135. One or more metallic materials (e.g., a metallic liner layer and a metallic fill material) as described above may be deposited over the upper surface of the fourth dielectric material layer 133 and within the via opening and the trench opening. The metallic material(s) may be deposited using a suitable deposition process as described above. A planarization process, such as a chemical mechanical planarization (CMP) process, may be used to remove excess metallic material(s) to provide the metal line 135 and the conductive via 137 as shown in FIG. 21. In some embodiments, the metal line 135 and the conductive via 137 may be formed at the same time (e.g., using a dual damascene process). Alternatively, the metal line 135 and the conductive via 137 may be formed using separate etching, deposition and planarization steps (e.g., using separate single damascene processes).

In some embodiments, the etching process used to form the via opening may include an initial etch to form an opening through the fourth dielectric material layer 133 and the buffer layer 131. The initial etch may stop at the third dielectric material layer 129, which may be an etch stop layer as described above. One or more additional etches may be used to extend the via opening through the third dielectric layer 129 and the hard mask 119 to expose the upper surface of the top electrode 117. The one or more additional etches may use a different etching chemistry than the initial etch.

Referring again to FIG. 21, the memory device 100 in this embodiment includes the second layer stack 127 having a barrier layer 109 over a bottom metal feature 103, a bottom electrode 111 over the barrier layer 109, a switching layer 113 over the bottom electrode 111, an optional capping layer 115 over the switching layer 113, a top electrode 117 over the optional capping layer 115, and a hard mask 119 over the top electrode 117. The second layer stack 127 may also include at least one spacer 123 over the upper surface of the switching layer 113 and over the side surfaces of the optional capping layer 115, the top electrode 117 and the hard mask 119. The second dielectric material layer 105 may extend under a portion of the second layer stack 127. The conductive via 137 may extend through the hard mask 119 and contact the upper surface of the top electrode 117.

Referring again to FIG. 21, the resistive memory device 100 may include a barrier layer 109 located between the bottom metal feature 103 and the bottom electrode 111. The barrier layer 109 may have a thickness that is 6 nm or less, such as between about 0.3 nm and about 6 nm, including between about 1 nm and about 4.5 nm. The barrier layer 109 may include an outer portion 134 that extends in a horizontal direction over the upper surface of the second dielectric material layer 105, and a central portion 136 that is vertically recessed relative to the outer portion 134 and extends in a horizontal direction over the upper surface of the bottom metal feature 103.

The bottom metal feature 103 and the conductive via 137 may be used to apply a voltage across the second layer stack 127 in order to change the switching layer 113 from a High Resistance State (HRS) to a Low Resistance State (LRS), and vice versa. A plurality of memory devices 100 such as shown in FIG. 21 may be formed in the exemplary structure. Each memory device 100 may form an individual memory element (e.g., memory cell) of an array 95 of resistive memory devices, such as described above with reference to FIGS. 1B and 1C.

Figures 22, 23:
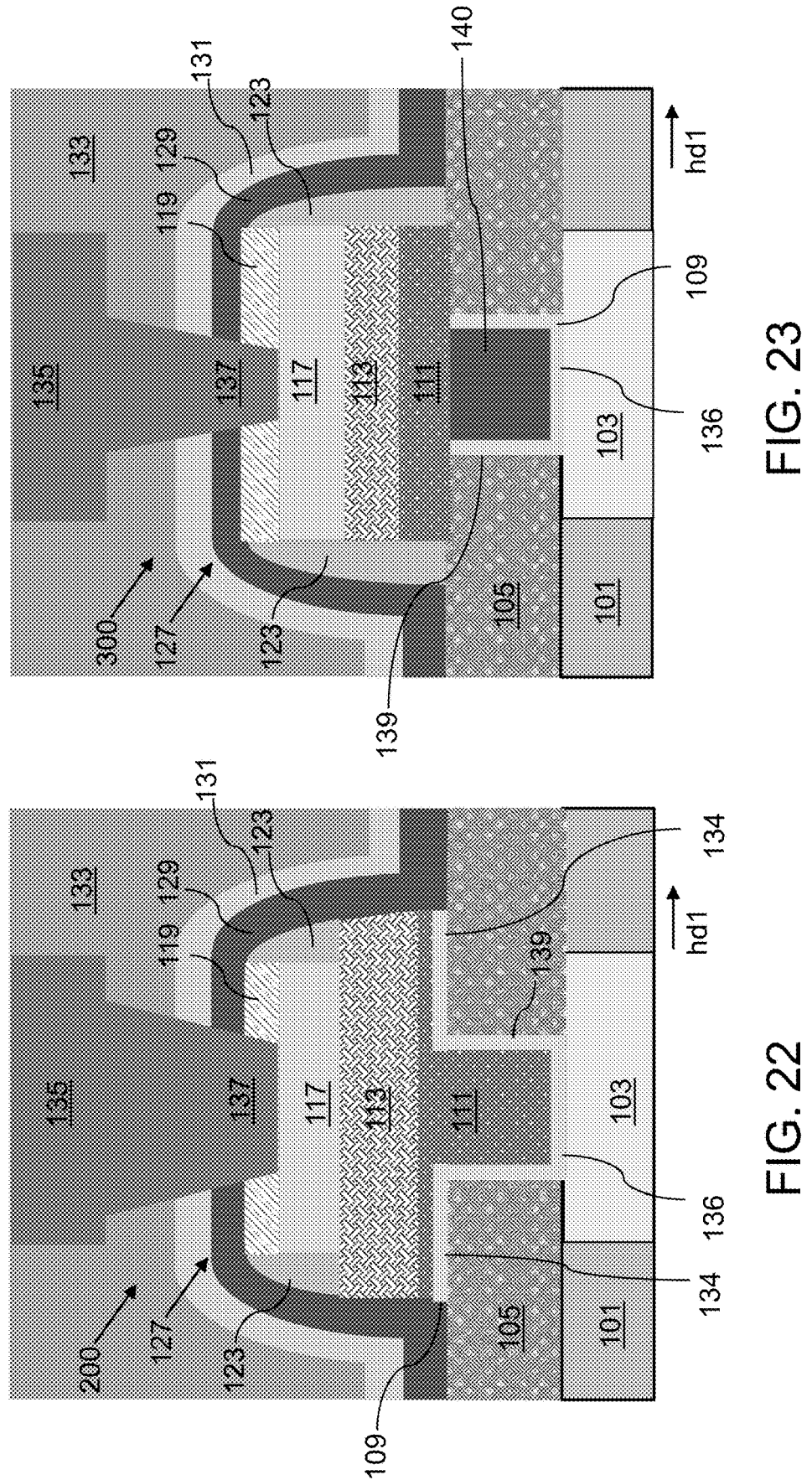
FIG. 22 is a vertical cross-section view of a resistive memory device according to another embodiment of the present disclosure.
FIG. 23 is a vertical cross-section view of a resistive memory device according to yet another embodiment of the present disclosure.

FIG. 22 is a vertical cross-section view of a resistive memory device 200 according to another embodiment of the present disclosure. The resistive memory device 200 shown in FIG. 22 may be similar to the resistive memory device 100 described above with reference to FIG. 21, and may include a second layer stack 127 having a barrier layer 109 over a bottom metal feature 103, a bottom electrode 111 over the barrier layer 109, a switching layer 113 over the bottom electrode 111, a top electrode 117 over the switching layer 113, and a hard mask 119 over the top electrode 117. The second layer stack 127 may also include at least one spacer 123 over the upper surface of the switching layer 113, the top electrode 117 and the hard mask 119. The second dielectric material layer 105 may extend under a portion of the second layer stack 127. A conductive via 137 may extend through a fourth dielectric material layer 133, a buffer layer 131, a third dielectric material layer 123, and the hard mask 119, and may contact the upper surface of the top electrode 117.

The resistive memory device 200 shown in FIG. 22 may differ from the resistive memory device 100 in FIG. 21 in that the optional capping layer 115 may be omitted from the second layer stack 127. The resistive memory device 200 shown in FIG. 22 may also differ from the resistive memory device 100 in FIG. 21 in that the bottom electrode 111 may have a planar upper surface. Thus, the switching layer 113, the top electrode 117 and the hard mask 119 which are located over the bottom electrode 111 in the second layer stack 127 may also have planar upper surfaces, and may not include a recessed central portion.

The resistive memory device 200 in the embodiment of FIG. 22 may include a barrier layer 109 located between the bottom metal feature 103 and the bottom electrode 111. The barrier layer 109 may have a thickness that is 6 nm or less, such as between about 0.3 nm and about 6 nm, including between about 1 nm and about 4.5 nm. The barrier layer 109 may include an outer portion 134 that extends in a horizontal direction over the upper surface of the second dielectric material layer 105, and a central portion 136 that is vertically recessed relative to the outer portion 134 and extends in a horizontal direction over the upper surface of the bottom metal feature 103. The barrier layer 109 may additionally include at least one vertical portion 139 extending in a vertical direction between the outer portion 134 and the recessed central portion 136 of the barrier layer 109. The at least one vertical portion 139 may laterally surround a lower portion of the bottom electrode 111 and may be located between the lower portion of the bottom electrode 111 and the second dielectric material layer 105.

FIG. 23 is a vertical cross-section view of a resistive memory device 300 according to yet another embodiment of the present disclosure. The resistive memory device 300 shown in FIG. 23 may be similar to the resistive memory device 100 described above with reference to FIG. 21, and may include a second layer stack 127 including a barrier layer 109, a bottom electrode 111 over the barrier layer 109, a switching layer 113 over the bottom electrode 111, a top electrode 117 over the switching layer 113, and a hard mask 119 over the top electrode 117. The second dielectric material layer 105 may extend under a portion of the second layer stack 127. A conductive via 137 may extend through a fourth dielectric material layer 133, a buffer layer 131, a third dielectric material layer 123, and the hard mask 119, and may contact the upper surface of the top electrode 117.

The resistive memory device 300 shown in FIG. 23 may differ from the resistive memory device 100 in FIG. 21 in that the optional capping layer 115 may be omitted from the second layer stack 127. The resistive memory device 300 shown in FIG. 23 may also differ from the resistive memory device 100 in FIG. 21 in that the second layer stack 127 may include at least one spacer 123 over the upper surface of the second dielectric material layer 105, and over the side surfaces of the bottom electrode 111, the switching layer 113, the top electrode 117, and the hard mask 119.

The resistive memory device 300 of FIG. 23 may also differ from the resistive memory device 100 of FIG. 21 in that the barrier layer 109 may include a central portion 136 extending in a horizonal direction over the bottom metal feature 103 and at least one vertical portion 139 extending in a vertical direction between the central portion 136 of the barrier layer and the lower surface of the bottom electrode 111. The barrier layer 109 in the embodiment of FIG. 23 may not include an outer portion that extends in a horizontal direction over the upper surface of the second dielectric material layer 105. The barrier layer 109 may have a thickness that is 6 nm or less, such as between about 0.3 nm and about 6 nm, including between about 1 nm and about 4.5 nm.

In addition, the resistive memory device 300 in the embodiment of FIG. 23 may include an extended electrode 140 that may be located over the central portion 136 of the barrier layer 109, and may be laterally surrounded by the at least one vertical portion 139 of the barrier layer 109. The central portion 136 of the barrier layer 109 may extend in a horizontal direction between the lower surface of the extended electrode 140 and the upper surface of the bottom metal feature 103. The at least one vertical portion 139 of the barrier layer 109 may extend between the side surface(s) of the extended electrode 140 and the second dielectric material layer 105. The upper surface of the extended electrode 140 may electrically contact the lower surface of the bottom electrode 111. The extended electrode 140 may include a suitable metallic material as described above. In some embodiments, the extended electrode 140 may be composed of the same metallic material as the bottom electrode 111. Alternatively, the extended electrode 140 may be composed of a different metallic material than the bottom electrode 111.

Figure 24:
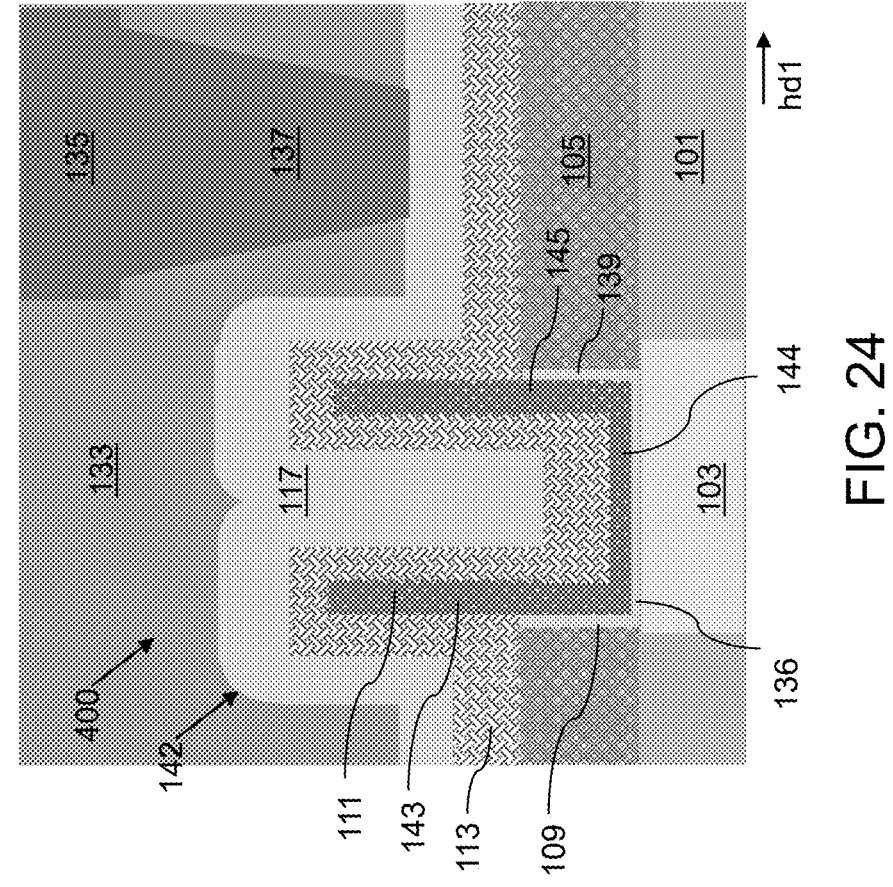
FIG. 24 is a vertical cross-section view of a resistive memory device according to yet another embodiment of the present disclosure.

FIG. 24 is a vertical cross-section view of a resistive memory device 400 according to yet another embodiment of the present disclosure. Referring to FIG. 24, the resistive memory device 400 may include a layer stack 142 including a barrier layer 109, a bottom electrode 111 over the barrier layer 109, a switching layer 113 over the bottom electrode 111, and a top electrode 117 over the switching layer 113. In the resistive memory device 400 shown in FIG. 24, the bottom electrode 111 may have a shape that resembles the letter "U" when viewed in cross-section along a plane parallel to the first horizontal direction hd1. In particular, the bottom electrode 111 may have a central portion 144 extending in a horizonal direction over the bottom metal feature 103 and a pair of vertical portions 143, 145 extending vertically upwards from either side of the central portion 144 of the bottom electrode 111. The pair of vertical portions 143, 145 may extend above a plane containing the upper surface of the second dielectric material layer 105. The switching layer 113 may extend horizontally over the upper surface of the second dielectric material layer 105, and conformally over the "U"-shaped bottom electrode 111 such that the switching layer 113 extends over the side surfaces and upper surface of each of the vertical portions 143, 145 of the bottom electrode 111, and horizontally over the central portion 144 of the bottom electrode 111. The top electrode 117 may extend conformally over the switching layer 113. The layer stack 142 in the embodiment shown in FIG. 24 does not include a capping layer 115, a hard mask 119 or spacers 129. In addition, the embodiment shown in FIG. 24 does not include a third dielectric material layer 123 or a buffer layer 131 over the layer stack 142.

The resistive memory device 400 of FIG. 24 includes a barrier layer 109 having a central portion 136 extending in a horizonal direction over the bottom metal feature 103 and at least one vertical portion 139 extending in a vertical direction between the central portion 136 of the barrier layer and a lower surface of the bottom electrode 111. The central portion 136 of the barrier layer 109 may be located between the bottom metal feature 103 and the central portion 144 of the bottom electrode 111, and vertical portions of the barrier layer 109 may be located between the respective vertical portions 143, 145 of the bottom electrode 111 and side surfaces of the second dielectric material layer 105. The barrier layer 109 may have a thickness that is 6 nm or less, such as between about 0.3 nm and about 6 nm, including between about 1 nm and about 4.5 nm.

The barrier layer 109 and the bottom electrode 111 may be located within an opening through the second dielectric material layer 105 and may not extend horizontally over the upper surface of the second dielectric material layer 105. Accordingly, the layer stack 142 over the upper surface of the second dielectric material layer 105 may include the switching layer 113 over the second dielectric material layer 105, and the top electrode 117 over the switching layer 113.

Referring again to FIG. 24, the resistive memory device 400 may additionally include a metal line 135 and a conductive via 137 extending from the metal line 135 through a fourth dielectric material layer 133 and contacting the upper surface of the top electrode 117. However, in the embodiment resistive memory device 400 illustrated in FIG. 24, the metal line 135 and the conductive via 137 may be laterally offset with respect to the bottom metal feature 103, the bottom electrode 111, and the barrier layer 109.

Figure 25:
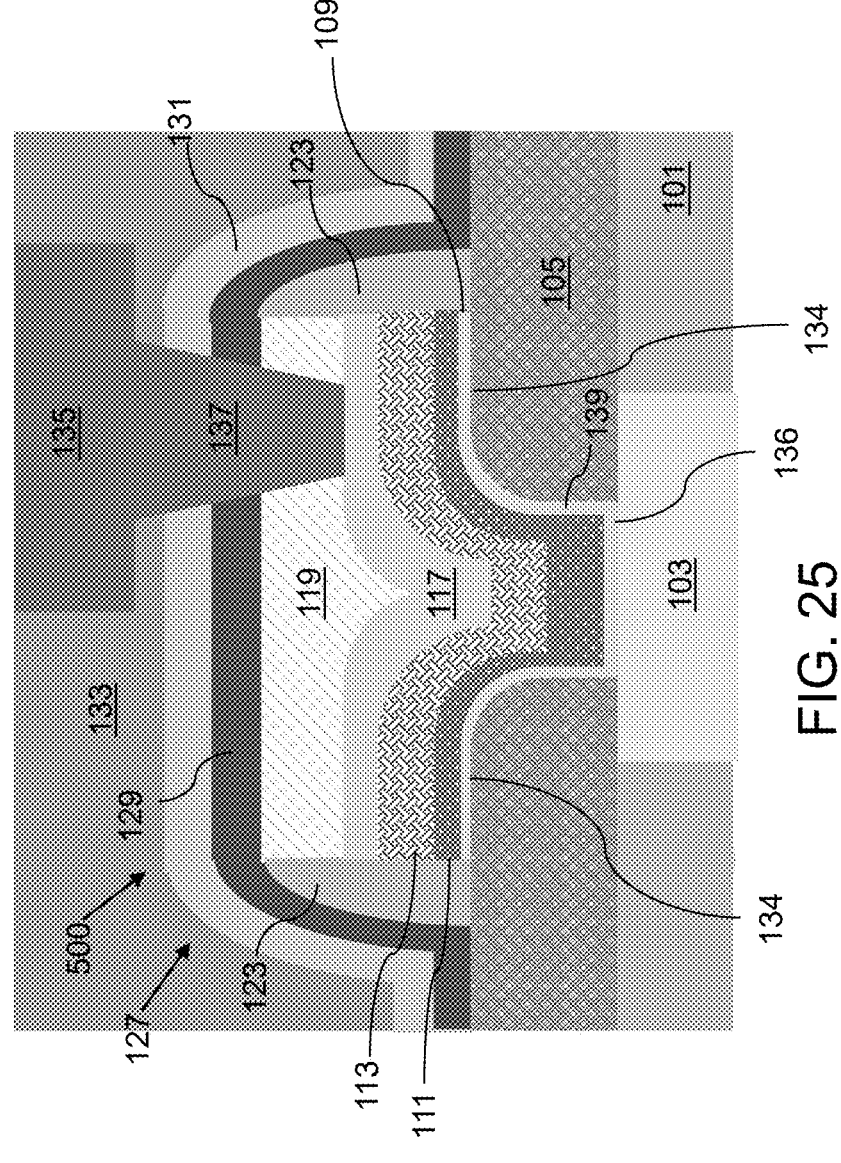
FIG. 25 is a vertical cross-section view of a resistive memory device according to yet another embodiment of the present disclosure.

FIG. 25 is a vertical cross-section view of a resistive memory device 500 according to another embodiment of the present disclosure. The resistive memory device 500 shown in FIG. 25 may be similar to the resistive memory device 100 described above with reference to FIG. 21, and may include a second layer stack 127 having a barrier layer 109 over a bottom metal feature 103, a bottom electrode 111 over the barrier layer 109, a switching layer 113 over the bottom electrode 111, a top electrode 117 over the switching layer 113, and a hard mask 119 over the top electrode 117. At least one spacer 123 may be located over the upper surface of the second dielectric material layer 105, and over the side surfaces of the barrier layer 109, the bottom electrode 111, the switching layer 113, the top electrode 117, and the hard mask 119. The optional capping layer 115 is not present in the second layer stack 127 of the resistive memory device 500.

The resistive memory device 500 in the embodiment of FIG. 25 may include a barrier layer 109 located between the bottom metal feature 103 and the bottom electrode 111. The barrier layer 109 may have a thickness that is 6 nm or less, such as between about 0.3 nm and about 6 nm, including between about 1 nm and about 4.5 nm. The barrier layer 109 may include an outer portion 134 that extends in a horizontal direction over the upper surface of the second dielectric material layer 105, and a central portion 136 that is vertically recessed relative to the outer portion 134 and extends in a horizontal direction over the upper surface of the bottom metal feature 103. The barrier layer 109 may additionally include at least one vertical portion 139 extending in a vertical direction between the outer portion 134 and the recessed central portion 136 of the barrier layer 109. The at least one vertical portion 139 may laterally surround a lower portion of the bottom electrode 111 and may be located between the lower portion of the bottom electrode 111 and the second dielectric material layer 105. The bottom electrode 111, the switching layer 113, and the top electrode 117 may have a similar shape as the barrier layer 109, and may each include an outer portion that extends in a horizontal direction over the outer portion 134 of the barrier layer 109, and a central portion that is vertically recessed with respect to the outer portion located above the recessed central portion 136 of the barrier layer 109.

Referring again to FIG. 25, the resistive memory device 500 may additionally include a metal line 135 and a conductive via 137 extending from the metal line 135 through a fourth dielectric material layer 133, a buffer layer 131, a third dielectric material layer 129, and the hard mask 119 and contacting the upper surface of the top electrode 117. In the embodiment resistive memory device 500 illustrated in FIG. 25, the metal line 135 and the conductive via 137 may be laterally offset with respect to the bottom metal feature 103. The conductive via 137 may contact the top electrode 117 on the outer portion of the top electrode 117 that extends in a horizontal direction.

Figure 26:
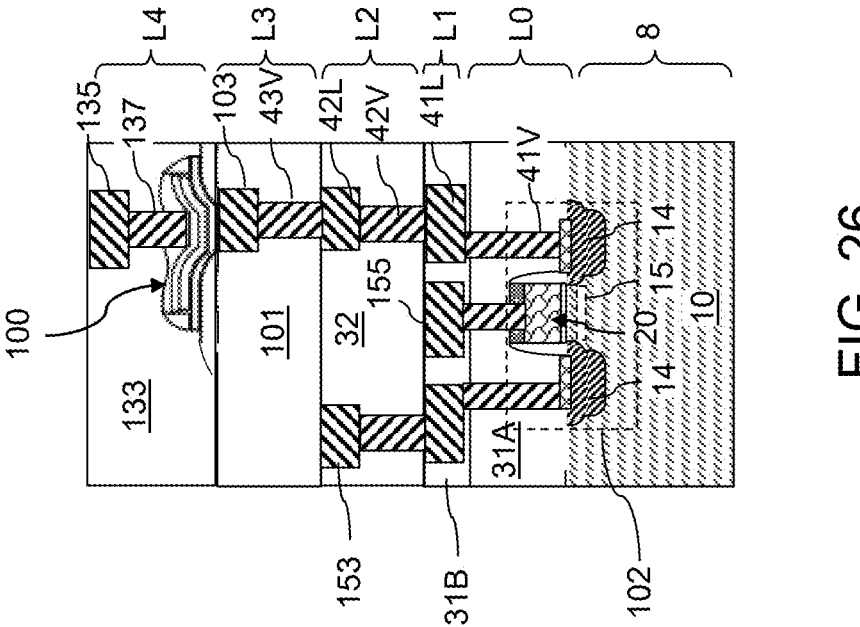
FIG. 26 is a vertical cross-section view of a resistive memory device according to yet another embodiment of the present disclosure.

FIG. 26 is a vertical cross-section view of a resistive memory device 100 and an access transistor 102 on a substrate 8 according to various embodiments of the present disclosure. Referring to FIG. 26, a resistive memory device 100 as described above may be arranged in a one transistorone resistor (1T1R) configuration in which each resistive memory device 100 (which may also be referred to as a resistive memory element or cell) is connected to one access transistor 102. In various embodiments, a two-dimensional array of memory cells 100 and corresponding access transistors 102 may be located on a substrate 8, such as a semiconductor substrate as described above with reference to FIGS. 1A-1C.

The access transistors 102 may provide functions that are needed to operate the resistive memory cells 100. Specifically, the access transistors 102 may be configured to control the programming operation, the erase operation, and the sensing (read) operation of the resistive memory cells 100. In some embodiments, sensing circuitry and/or a top electrode bias circuitry may be located on the substrate 8. In some embodiments, the access transistors 102 may be field effect transistors (FETs), and may include complementary metal-oxide-semiconductor (CMOS) transistors. While the embodiment illustrated in FIG. 26 illustrates a CMOS transistor 102, other transistors such as fin FET, thin-film transistors (TFT), etc., may be used as well.

Metal interconnect structures (e.g., 41V, 41L, 42V, 42L, 43V, 103, 135, 137, 153, 155) may be configured to connect each resistive memory cell 100 to an access transistor 102, and to connect the access transistor 102 to corresponding signal lines. For example, a first active region 14 (e.g., the drain region) of the access transistor 102 may be electrically connected to a bottom electrode of the memory cell 100 via, for example, a subset of the metal interconnect structures. The gate structure 20 of the access transistor 102 may be electrically connected to a word line, which may be embodied as a metal interconnect structure (such as metal line 155). A top electrode of the memory cell 100 may be electrically connected to a bit line, which may be embodied as a metal interconnect structure (such as metal line 135). A second active region 14 (e.g., the source region) of the access transistor 102 may be electrically connected to a source line, which may be embodied as a metal interconnect structure (such as metal line 153). While only four levels of metal lines are illustrated in FIG. 26, it is understood that more metal line levels may be formed above the illustrated levels of FIG. 26. Further, it is understood that the levels in which the source lines, word lines, and bit lines are located, and the relative orientations of these lines, may be selected based on design parameters.

FIG. 27 is a flowchart illustrating a method 301 of fabricating a resistive memory device 100, 200, 300, 400, 500 according to an embodiment of the present disclosure. Referring to FIGS. 3 and 27, in step 302 of method 301, a dielectric material layer 105 may be formed over a metal feature 103. Referring to FIGS. 4, 5 and 27, in step 304 of method 301, the dielectric material layer 105 may be etched to form an opening 108 through the dielectric material layer 105 exposing a surface of the metal feature 103 at the bottom of the opening 108. Referring to FIGS. 6 and 27, in step 306 of method 301, a barrier layer 109 may be formed over the surface of the metal feature 103 that is exposed in the bottom of the opening 108, where the barrier layer 109 has a thickness $T_1$ that is 6 nm or less. In some embodiments, the barrier layer 109 may be formed by atomic layer deposition (ALD).

Referring to FIGS. 7 and 27, in step 308 of method 301, a bottom electrode 111 may be formed over the barrier layer 109. Referring to FIGS. 8 and 27, in step 310 of method 301, a switching layer 113 may be formed over the bottom electrode 111. Referring to FIGS. 19 and 27, in step 312 of method 301, a top electrode 117 may be formed over the switching layer 113. Referring to FIGS. 21 and 27, in step 314 of method 301, a conductive via 137 may be formed contacting the top electrode 117.

Referring to all drawings and according to various embodiments of the present disclosure, a resistive memory device 100, 200, 300, 400, 500 includes a metal feature 103, a barrier layer 109 having a thickness $T_1$ of 6 nm or less over the metal feature 103, a bottom electrode 111 over the barrier layer 109, a switching layer 113 over the bottom electrode 111, a top electrode 117 over the switching layer 113, and a conductive via 137 contacting the top electrode 117.

In one embodiment, the barrier layer 109 includes a conductive oxide, nitride and/or oxynitride material that is configured to prevent diffusion of material of the metal feature 103 into the bottom electrode 111.

In another embodiment, the switching layer 113 includes a solid-state dielectric material that is switchable between a High Resistance State (HRS) and a Low Resistance State (LRS).

In another embodiment, resistive memory device further includes a first dielectric material layer 101 laterally surrounding the metal feature 103, a second dielectric material layer 105 over the first dielectric material layer 101 and having an opening 108 through the second dielectric material layer 105, the barrier layer 109 including a portion 136 extending over the metal feature 103 in a bottom of the opening 108 through the second dielectric material layer 105.

In another embodiment, the barrier layer 109 further includes at least one vertical portion 139 that extends along a sidewall of the opening 108 through the second dielectric material layer 105.

In another embodiment, the bottom electrode 111 has a U-shaped cross-sectional shape including a central portion 144 extending in a horizontal direction within the opening 108 through the second dielectric material layer 105 and a pair of vertical portions 143, 145 extending vertically upwards from opposite sides of the central portion 144 of the bottom electrode 111 and extending above a plane containing an upper surface of the second dielectric material layer 105, the switching layer 113 extends conformally over the side surfaces and upper surface of each of the vertical portions 143, 145 of the bottom electrode 111 and over the central portion 145 of the bottom electrode 111, and the top electrode 117 extends conformally over the switching layer 113.

In another embodiment, the resistive memory device further includes an extended electrode 140 located within the opening 108 through the second dielectric material layer 105 and surrounded on bottom and lateral side surfaces by the barrier layer 109, where the bottom electrode 111 is located over an upper surface of the extended electrode 140.

In another embodiment, the barrier layer 109 further includes an outer portion 134 that extends over an upper surface of the second dielectric material layer 105, where the portion 136 of the barrier layer 109 extending over the metal feature 103 in the bottom of the opening 108 through the second dielectric material layer 105 is a central portion 136 of the barrier layer 109 that is vertically recessed relative to the outer portion 134 of the barrier layer 109.

In another embodiment, the resistive memory device includes a layer stack 127 over a first portion of the second dielectric layer 105 and the opening 108 through the second dielectric layer 105, where the layer stack 127 includes the barrier layer 109, the bottom electrode 111, the switching layer 113, the top electrode 117, and a hard mask 119 over the top electrode 117, the conductive via 137 extending through the hard mask 119 and contacting the top electrode 117.

In another embodiment, the layer stack 127 further includes a capping layer 115 between the switching layer 113 and the top electrode 117 that is configured to provide an oxygen storage function that facilitates phase changes in switching layer 113, and at least one spacer 123 located over a side surface of the capping layer 115, the top electrode 117 and the hard mask 119.

In another embodiment, the resistive memory device further includes a third dielectric material layer 129 over the upper surface of the second dielectric material layer 105 and the side surfaces and upper surface of the layer stack 127, a buffer layer 131 over the third dielectric material layer 129, and a fourth dielectric material layer 133 over the buffer layer 131, where the conductive via 137 extends through the fourth dielectric material layer 133, the buffer layer 131, the third dielectric material layer 129 and the hard mask 119 and contacts the top electrode 117.

In another embodiment, a second portion of the second dielectric material layer 105 laterally surrounds the layer stack 127, and a thickness $T_2$ of the second portion of the second dielectric material layer 105 has a half-range uniformity percentage of less than 9%.

In another embodiment, the conductive via 137 is laterally offset with respect to the metal feature 103.

Another embodiment is drawn to a resistive memory device 100, 200, 300, 400, 500 including a dielectric material layer 105, a layer stack 127 over a first portion of the dielectric material layer 105, where the layer stack 127 includes a barrier layer 109, a bottom electrode 111 over the barrier layer 109, a switching layer 113 over the bottom electrode 111, and a top electrode 117 over the switching layer 113, where a second portion of the dielectric material layer 105 laterally surrounds the layer stack 127, and a maximum step height H between an upper surface 138 of the second portion of the dielectric material layer 105 and an upper surface of the top electrode 117 of the layer stack 127 is less than 80 nm.

In one embodiment, the dielectric material layer 105 is an etch stop layer, at least a portion of the barrier layer 109 is located within an opening 108 through the etch stop layer 105 and electrically contacts a metal feature 103 underlying the layer stack 127, and the resistive memory device further includes a conductive via 137 contacting the top electrode 117.

In another embodiment, the resistive memory device includes a plurality of layer stacks 127, each layer stack 127 including a barrier layer 109, a bottom electrode 111 over the barrier layer 109, a switching layer 113 over the bottom electrode 111, and a top electrode 117 over the switching layer 113 and each layer stack 127 forms an individual resistive memory element of an array of resistive memory elements, where the etch stop layer 105 extends continuously between each layer stack 127 and a maximum step height between the upper surface of the etch stop layer 105 and the upper surface of the top electrode 117 in each of the layer stacks 127 is less than 80 nm.

Another embodiment is drawn to a method of fabricating a resistive memory device 100, 200, 300, 400, 500 that includes forming a dielectric material layer 105 over a metal feature 103, etching the dielectric material layer 105 to form an opening 108 through the dielectric material layer 105 exposing a surface of the metal feature 103 at the bottom of the opening 108, forming a barrier layer 109 over the surface of the metal feature 103 that is exposed in the bottom of the opening 108, where the barrier layer 109 has a thickness T$_1$ that is 6 nm or less, forming a bottom electrode 111 over the barrier layer 109, forming a switching layer 113 over the bottom electrode 111, forming a top electrode 117 over the switching layer 113, and forming a conductive via 137 contacting the top electrode 117.

In one embodiment, the barrier layer 109 is formed by atomic layer deposition (ALD).

In another embodiment, forming the barrier layer 109 includes forming a continuous barrier layer 109L over the upper surface 138 of the dielectric material layer 105 and within the opening 108 through the dielectric material layer 105, and etching the continuous barrier layer 109L through a patterned mask 125 to remove a portion of the continuous barrier layer 109L and expose the upper surface 138 of the dielectric material layer 105, wherein following the etching of the continuous barrier layer 109L, a thickness T$_2$ of the second dielectric material layer 105 has a half-range uniformity percentage of less than 9%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a resistive memory device, comprising:
    depositing a dielectric material layer over a metal feature;
    etching the dielectric material layer to form an opening through the dielectric material layer exposing a surface of the metal feature at a bottom of the opening;
    depositing a continuous barrier layer, wherein the continuous barrier layer has a thickness that is 6 nm or less;
    depositing a bottom electrode over the continuous barrier layer;
    depositing a switching layer over the bottom electrode;
    depositing a top electrode over the switching layer;
    forming a conductive via contacting the top electrode; and
    etching the continuous barrier layer to expose an upper surface of the dielectric material layer, thereby forming a discrete barrier layer that remains extending within the opening through the dielectric material layer and extending horizontally wider than the metal feature.

2. The method of claim 1, wherein the continuous barrier layer is formed deposited by atomic layer deposition (ALD).

3. The method of claim 1, wherein:
    depositing the continuous barrier layer comprises depositing the continuous barrier layer over the upper surface of the dielectric material layer; and
    etching the continuous barrier layer comprises etching the continuous barrier layer through a patterned mask to expose the upper surface of the dielectric material layer, wherein following the etching of the continuous barrier layer, a thickness of the dielectric material layer has a half-range uniformity percentage of less than 9%, wherein the half-range uniformity percentage is equal to one-half of the range between a maximum thickness and a minimum thickness of the dielectric material layer divided by a mean thickness of the dielectric material layer, multiplied by 100.

4. The method of claim 3, wherein depositing the bottom electrode over the continuous barrier layer and depositing the switching layer over the bottom electrode comprises:
    depositing a continuous bottom electrode layer over the continuous barrier layer; and
    depositing a continuous switching layer over the continuous bottom electrode layer, and wherein etching the continuous barrier layer through the patterned mask comprises:
        etching the continuous switching layer, the continuous bottom electrode layer and the continuous barrier layer through the patterned mask to provide the discrete barrier layer over the metal feature and the dielectric material layer, the bottom electrode over the discrete barrier layer, and the switching layer over the bottom electrode.

5. The method of claim 4, wherein the method further comprises:
    depositing a continuous top electrode layer over the continuous switching layer;
    depositing a continuous hard mask layer over the continuous top electrode layer; and
    etching the continuous hard mask layer and the continuous top electrode layer through an additional patterned mask to form a first layer stack comprising a discrete top electrode over the continuous switching layer and a discrete hard mask over the discrete top electrode.

6. The method of claim 5, further comprising:
    performing a planarization process to provide a planar upper surface of the continuous hard mask layer, wherein the continuous top electrode layer, the continuous switching layer, the continuous bottom electrode layer, and the continuous barrier layer have non-planar upper surfaces underlying the planar upper surface of the continuous hard mask layer.

7. The method of claim 5, further comprising:
    depositing a continuous capping layer over the continuous switching layer, wherein the continuous top electrode layer and the continuous hard mask layer are formed over the continuous capping layer, and the continuous hard mask layer, the continuous top electrode layer and the continuous capping layer are etched through the additional patterned mask to form the first layer stack comprising a discrete capping layer over the continuous switching layer, the discrete top electrode over the discrete capping layer, and the discrete hard mask over the discrete top electrode, wherein the discrete capping layer is configured to provide an oxygen storage function that facilitates phase changes in the continuous switching layer.

8. The method of claim 5, further comprising:
    depositing at least one spacer comprising a dielectric material over the upper surface of the continuous switching layer and along a side surface of the first layer stack.

9. The method of claim 8, wherein following the etching of the continuous switching layer, the continuous bottom electrode layer and the continuous barrier layer, a maximum vertical distance between the upper surface of the dielectric material layer and an upper surface of the top electrode is less than 80 nm.

10. The method of claim 9, wherein the maximum vertical distance between the upper surface of the dielectric material layer and the upper surface of the top electrode is less than 70 nm.

11. The method of claim 8, further comprising:

depositing a second dielectric material layer over the upper surface of the dielectric material layer, along side surfaces of the discrete barrier layer, the bottom electrode, and the switching layer, over the at least one spacer, and over an upper surface of the discrete hard mask using a conformal deposition process; and depositing a third dielectric material layer over the second dielectric material layer, wherein the conductive via is formed through the third dielectric material layer, the second dielectric material layer and the discrete hard mask.

12. The method of claim 11, further comprising:

depositing a buffer layer comprising a dielectric material over the second dielectric material layer using the conformal deposition process, wherein the third dielectric material layer is formed over the buffer layer, the buffer layer is configured to reduce stress between the second dielectric material layer and the third dielectric material layer, and the conductive via is formed through the third dielectric material layer, the buffer layer, the second dielectric material layer, and the discrete hard mask.

13. The method of claim 1, wherein the switching layer comprises a solid-state dielectric material that is switchable between a High Resistance State (HRS) and a Low Resistance State (LRS), the continuous barrier layer comprises a conductive oxide, nitride or oxynitride material that is configured to prevent diffusion of material of the metal feature into the bottom electrode, and the dielectric material layer comprises silicon carbide.

14. A method of fabricating a resistive memory device, comprising:

depositing a continuous barrier layer comprising a conductive oxide, nitride or oxynitride material over an upper surface and a side surface of an etch stop layer and an upper surface of a metal feature using a conformal deposition process, the continuous barrier layer having a thickness of 6 nm or less;

depositing a continuous bottom electrode, a continuous switching layer, and a continuous top electrode layer over the continuous barrier layer; and etching through portions of the continuous barrier layer to provide a layer stack comprising a discrete barrier layer, a discrete bottom electrode over the discrete barrier layer, a discrete switching layer over the discrete bottom electrode, and a discrete top electrode over the discrete switching layer, wherein the discrete barrier layer extends within an opening through the etch stop layer and extends horizontally wider than the metal feature, wherein the etch stop layer is exposed around a periphery of the layer stack.

15. The method of claim 14, wherein the conformal deposition process comprises thermal or plasma atomic layer deposition (ALD) that is performed at a temperature between 150° C. and 300° C.

16. The method of claim 15, wherein the continuous barrier layer comprises tantalum nitride, and the ALD process used to form the continuous barrier layer utilizes pentakis (dimethylamino) tantalum (V) (PDMAT) or tantalum chloride ($TaCl_5$) as a tantalum precursor, and ammonia ($NH_3$) as a nitrogen precursor.

17. The method of claim 15, wherein the thickness of the continuous barrier layer is between 2 nm and 3 nm.

18. A method of fabricating a resistive memory device, comprising:

depositing an etch stop layer comprising a dielectric material;

etching a plurality of openings through the etch stop layer wherein a metal feature is exposed within each of the openings, wherein each opening exposes a portion of an upper surface of the metal feature;

depositing a continuous barrier layer having a thickness of 6 nm or less over the etch stop layer and in electrical contact with the metal feature;

depositing a continuous bottom electrode layer, a continuous switching layer and a continuous top electrode layer over the continuous barrier layer; and performing one or more etching processes to remove portions of the continuous top electrode layer, the continuous switching layer, the continuous bottom electrode layer and the continuous barrier layer to expose an upper surface of the etch stop layer and provide a plurality of layer stacks, each layer stack comprising a discrete barrier layer that extends within a respective one of the openings through the etch stop layer, extends horizontally wider than the metal feature, and is in electrical contact with the metal feature, a bottom electrode over the barrier layer, a switching layer over the bottom electrode, and a top electrode over the switching layer, wherein the etch stop layer extends between the plurality of layer stacks, and a thickness of an area of the etch stop layer extending between the layer stacks has a half-range uniformity percentage of less than 9%.

19. The method of claim 18, wherein a step height between an upper surface of the etch stop layer and an upper surface of the top electrode in each of the layer stacks is less than 80 nm.

20. The method of claim 18, wherein the thickness of the etch stop layer extending between the layer stacks has a 3-sigma uniformity metric of less than 14%, wherein the 3-sigma uniformity metric is defined as three times the standard deviation of the thickness divided by a mean thickness, multiplied by 100%.

* * * * *